US012604563B2

(12) United States Patent
Ryu

(10) Patent No.: US 12,604,563 B2
(45) Date of Patent: Apr. 14, 2026

(54) LIGHT EMITTING DEVICE AND LIGHT EMITTING MODULE HAVING THE SAME

(71) Applicant: SEOUL VIOSYS CO., LTD., Ansan-si (KR)

(72) Inventor: Yong Woo Ryu, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 387 days.

(21) Appl. No.: 18/134,009

(22) Filed: Apr. 12, 2023

(65) Prior Publication Data

US 2023/0352619 A1 Nov. 2, 2023

Related U.S. Application Data

(60) Provisional application No. 63/454,292, filed on Mar. 23, 2023, provisional application No. 63/334,584, filed on Apr. 25, 2022.

(51) Int. Cl.
| | |
|---|---|
| *H10H 20/813* | (2025.01) |
| *H10H 20/814* | (2025.01) |
| *H10H 20/821* | (2025.01) |
| *H10H 20/831* | (2025.01) |
| *H10H 20/855* | (2025.01) |

(52) U.S. Cl.
CPC ........ *H10H 20/813* (2025.01); *H10H 20/814* (2025.01); *H10H 20/821* (2025.01); *H10H 20/8314* (2025.01); *H10H 20/855* (2025.01)

(58) Field of Classification Search
None
See application file for complete search history.

(56) References Cited

U.S. PATENT DOCUMENTS

| | | | |
|---|---|---|---|
| 10,622,520 B2 | 4/2020 | Yoon et al. | |
| 11,538,850 B2 | 12/2022 | Li et al. | |

(Continued)

FOREIGN PATENT DOCUMENTS

| | | |
|---|---|---|
| KR | 10-2012-0126496 | 11/2012 |
| KR | 10-2019-0090485 | 8/2019 |

(Continued)

OTHER PUBLICATIONS

International Search Report dated Jul. 25, 2023 issued to PCT/KR2023/005026.

*Primary Examiner* — Bilkis Jahan
(74) *Attorney, Agent, or Firm* — Oblon, McClelland, Maier & Neustadt, L.L.P.

(57) ABSTRACT

A light emitting device including a first sub-unit emitting light of a first wavelength; a second sub-unit disposed under the first sub-unit and emitting light of a second wavelength longer than the first wavelength; and a third sub-unit disposed under the second sub-unit and emitting light of a third wavelength longer than the first wavelength, in which the first sub-unit, the second sub-unit, and the third sub-unit include a first LED stack, a second LED stack, and a third LED stack, respectively, and the first sub-unit further includes a first upper contact electrode and a first lower contact electrode electrically connected to an upper surface and a lower surface of the first LED stack, respectively, and an extraction element for increasing a light extraction efficiency of the first wavelength.

19 Claims, 29 Drawing Sheets

(56)                    References Cited

U.S. PATENT DOCUMENTS

| | | | |
|---|---|---|---|
| 2004/0096996 A1* | 5/2004 | Cheng ................. | H01S 5/18305 |
| | | | 438/22 |
| 2005/0062049 A1* | 3/2005 | Lin ........................ | H10H 29/14 |
| | | | 257/79 |
| 2010/0112736 A1* | 5/2010 | Lebby .................. | H10H 29/142 |
| | | | 257/E33.068 |
| 2013/0285076 A1* | 10/2013 | Liu ...................... | H10H 20/813 |
| | | | 257/E33.012 |
| 2016/0020431 A1* | 1/2016 | Yamae ................... | H10K 59/32 |
| | | | 257/40 |
| 2016/0064682 A1* | 3/2016 | Yamae ................ | H10K 59/878 |
| | | | 257/40 |
| 2016/0336482 A1* | 11/2016 | Lu ........................ | H01L 25/0756 |
| 2020/0211446 A1* | 7/2020 | Mays ........................ | G09G 3/32 |
| 2023/0037604 A1 | 2/2023 | Chae et al. | |
| 2023/0051845 A1 | 2/2023 | Zollner et al. | |

FOREIGN PATENT DOCUMENTS

| | | |
|---|---|---|
| KR | 10-2022-0024706 | 3/2022 |
| KR | 10-2022-0048467 | 4/2022 |
| WO | 2021-150688 | 7/2021 |

* cited by examiner

1000a

1000b

1000c

1000e

LIGHT EMITTING DEVICE AND LIGHT EMITTING MODULE HAVING THE SAME

CROSS REFERENCE TO RELATED APPLICATIONS

This application claims the benefit of U.S. Provisional Patent Application No. 63/334,584, filed on Apr. 25, 2022, and United State Provisional Patent Application No. 63/454,292, filed on Mar. 23, 2023, each of which is hereby incorporated by reference for all purposes as if fully set forth herein.

BACKGROUND

Field

Exemplary embodiments of the invention relate generally to a light emitting device and more specifically, to a light emitting module including the same.

Discussion of the Background

Light emitting devices are semiconductor devices using light emitting diodes which are inorganic light sources, and are used in various technical fields, such as display apparatuses, automobile lamps, general lighting, and the like. Light emitting diodes have advantages, such as longer lifespan, lower power consumption, and quicker response, than conventional light sources, and thus, the light emitting diodes have been replacing the conventional light sources.

Conventional light emitting devices have been generally used as backlight light sources in display apparatuses, but display apparatuses that directly realize images using the light emitting devices have been recently developed. Such displays are also referred to as micro LED displays.

In general, the display apparatus realizes various colors using a mixed color of blue, green, and red. The display apparatus includes a plurality of pixels in order to realize various images, each including sub-pixels corresponding to one of blue, green, and red light. As such, a color of a certain pixel is typically determined based on the colors of the sub-pixels, so that images can be realized through the combination of such pixels.

In a case of the micro LED display, micro LEDs are arranged on a plane corresponding to each sub-pixel, and a large number of micro LEDs are mounted on a single substrate. However, since the micro LEDs are very small, typically less than 200 μm or even less than 100 μm, it is generally difficult to transfer the micro LEDs to a circuit board. In addition, a technique for physically protecting the light emitting device without optical distortion or loss of luminance is required even after the small-sized light emitting device is mounted on the circuit board.

Furthermore, when radiation patterns of blue light, green light, and red light emitted from one pixel are different from one another, a color of an image may be changed according to an angle at which a user views a display screen, that is, a viewing angle. Accordingly, there is a need for a technology for improving an image quality of the display apparatus, particularly for reducing a color difference depending on viewing angles, in addition to a technology for simply protecting the light emitting device.

Meanwhile, a pixel constituting one pixel by vertically stacking sub-pixels has been developed. For example, a red sub-pixel emitting red light, a green sub-pixel emitting green light, and a blue sub-pixel emitting blue light may be vertically stacked. In a case of a pixel having such a stacked structure, since red light is emitted to the outside through the green sub-pixel and the blue sub-pixel, an extraction efficiency of red light is considerably low.

The above information disclosed in this Background section is only for understanding of the background of the inventive concepts, and, therefore, it may contain information that does not constitute prior art.

SUMMARY

Exemplary embodiments provide a light emitting device having an improved radiation efficiency of the light emitting device and a light emitting module including the same.

Exemplary embodiments also provide a light emitting device having an improved radiation efficiency of red light and a light emitting module including the same.

Additional features of the inventive concepts will be set forth in the description which follows, and in part will be apparent from the description, or may be learned by practice of the inventive concepts.

A light emitting device according to an exemplary embodiment includes a first sub-unit emitting light of a first wavelength; a second sub-unit disposed under the first sub-unit and emitting light of a second wavelength longer than the first wavelength; and a third sub-unit disposed under the second sub-unit and emitting light of a third wavelength longer than the first wavelength, in which the first sub-unit, the second sub-unit, and the third sub-unit include a first LED stack, a second LED stack, and a third LED stack, respectively, and the first sub-unit further includes a first upper contact electrode and a first lower contact electrode electrically connected to an upper surface and a lower surface of the first LED stack, respectively, and an extraction element for increasing a light extraction efficiency of the first wavelength.

In an exemplary embodiment, the extraction element may be a distributed Bragg reflector disposed between the first upper contact electrode and the first LED stack.

The first LED stack may include a first conductivity type semiconductor layer, an active layer, and a second conductivity type semiconductor layer, and the first upper contact electrode may be in ohmic contact with the first conductivity type semiconductor layer.

The distributed Bragg reflector may be patterned to expose an upper surface of the first conductivity type semiconductor layer, and the first upper contact electrode may be connected to the exposed first conductivity type semiconductor layer.

The first conductivity type semiconductor layer may be exposed in a plurality of regions spaced apart from one another, and the first upper contact electrode may be connected to the first conductivity type semiconductor layer in the plurality of regions.

The distributed Bragg reflector may have a thickness in a range of 1 μm to 5 μm.

The distributed Bragg reflector may cover the upper surface and side surfaces of the first LED stack.

In an exemplary embodiment, the extraction element may be disposed between the first LED stack and the second sub-unit.

The extraction element may provide regions having different refraction indices in a transverse direction between the first LED stack and the second sub-unit.

The first sub-unit may further include a first lower contact electrode in ohmic contact with a lower portion of the first LED stack, and the extraction element may be formed of a material layer having a refraction index different from that of the first lower contact electrode.

The extraction element may be disposed between the first lower contact electrode and the first LED stack.

The extraction element may be patterned to expose the lower surface of the first LED stack, and the first lower contact electrode may be connected to the exposed lower surface of the first LED stack.

The light emitting device may further include a first adhesive layer disposed between the first sub-unit and the second sub-unit, the first lower contact electrode may be patterned to have a plurality of holes, and the extraction element may be formed by the first adhesive layer filling the plurality of holes.

The first sub-unit may further include a first lower contact electrode in ohmic contact with the lower portion of the first LED stack, and the extraction element may be disposed between the first lower contact electrode and the second sub-unit.

The light emitting device may further include a first adhesive layer disposed between the first sub-unit and the second sub-unit, the extraction element may be patterned to expose the first lower contact electrode, and the first adhesive layer may contact the exposed first lower contact electrode.

The extraction element may include a concavo-convex pattern formed on a lower surface of the first lower contact electrode.

A light emitting module according to an exemplary embodiment includes a circuit board and a plurality of light emitting devices arranged on the circuit board. Each of the light emitting devices may include a first sub-unit emitting light of a first wavelength; a second sub-unit disposed under the first sub-unit and emitting light of a second wavelength longer than the first wavelength; and a third sub-unit disposed under the second sub-unit and emitting light of a third wavelength longer than the first wavelength, in which the first sub-unit, the second sub-unit, and the third sub-unit include a first LED stack, a second LED stack, and a third LED stack, respectively, and the first sub-unit further includes a first upper contact electrode and a first lower contact electrode electrically connected to an upper surface and a lower surface of the first LED stack, respectively, and an extraction element for increasing a light extraction efficiency of the first wavelength.

In an exemplary embodiment, the extraction element may be a distributed Bragg reflector disposed between the first upper contact electrode and the first LED stack.

In an exemplary embodiment, the extraction element may be disposed between the first LED stack and the second sub-unit.

The extraction element may provide regions having different refraction indices in a transverse direction between the first LED stack and the second sub-unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
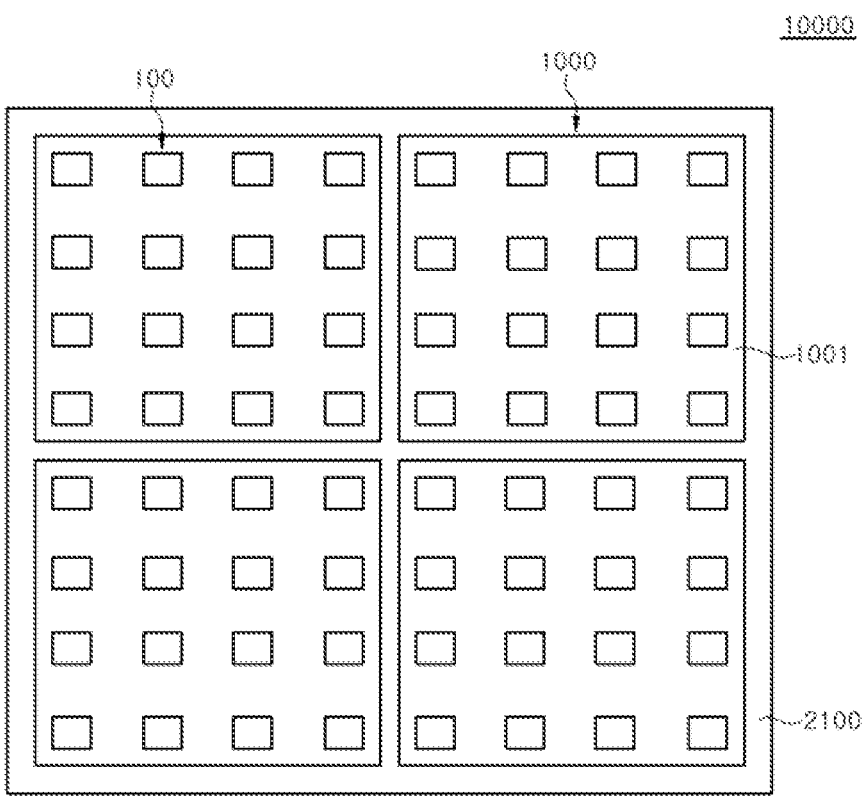
FIG. 1A is a schematic plan view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1B:
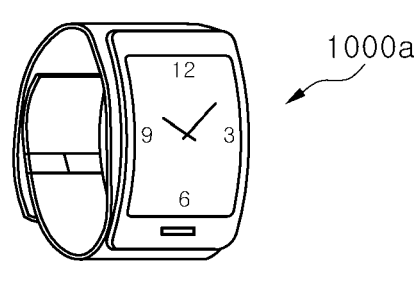
FIG. 1B shows schematic perspective views of various display apparatuses according to an exemplary embodiment.
Figure 1B:
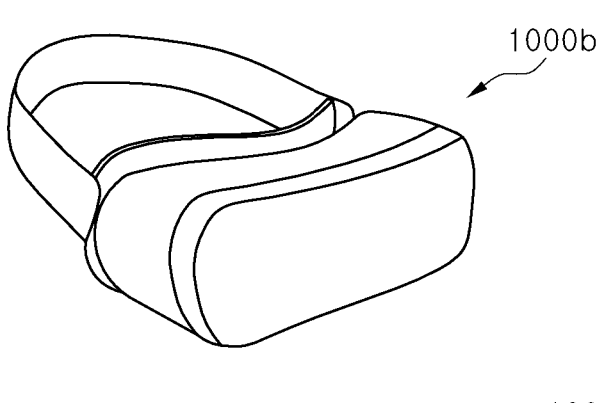
Figure 1B:
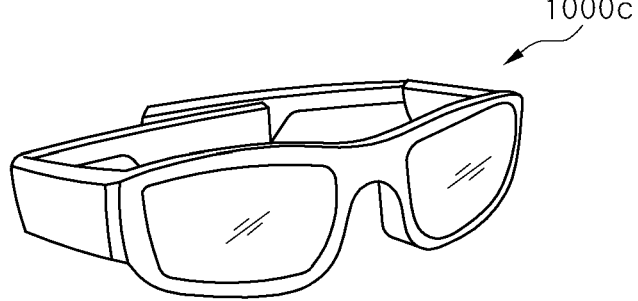
Figure 1C:
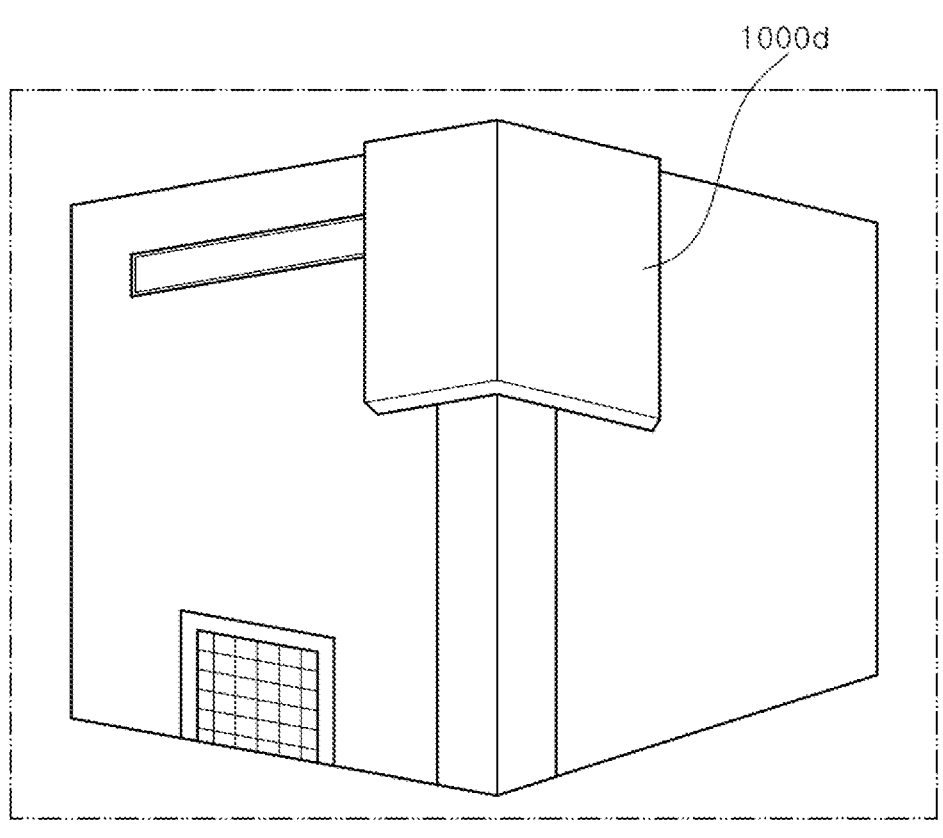
FIG. 1C is a schematic perspective view illustrating another display apparatus according to an exemplary embodiment.
Figure 1D:
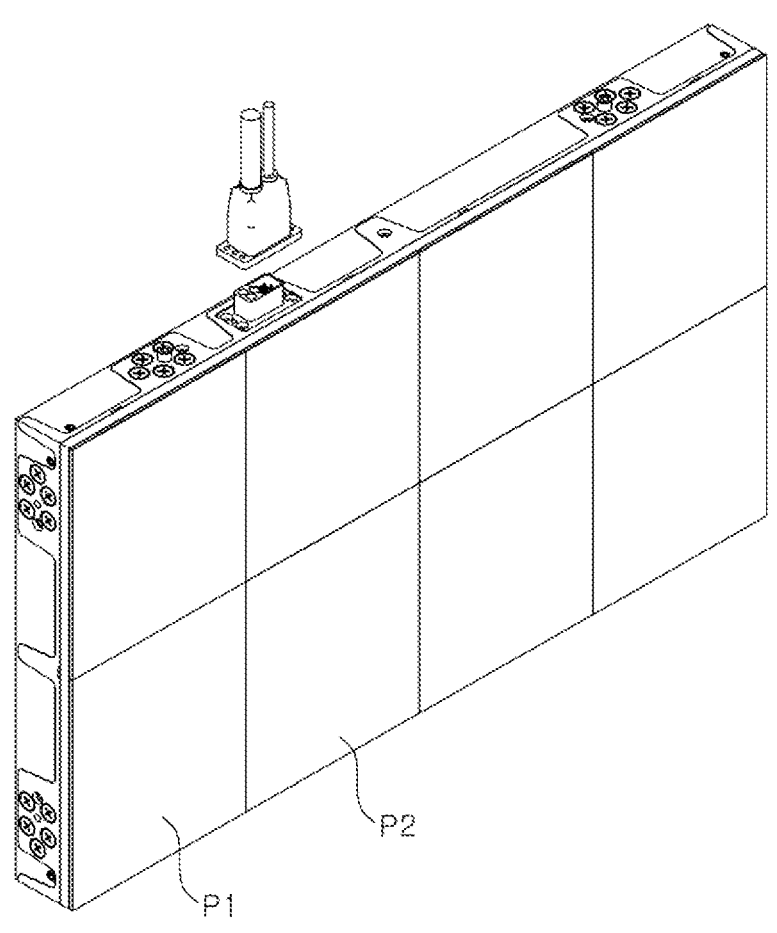
FIG. 1D is a schematic perspective view illustrating another display apparatus according to an exemplary embodiment.

FIG. 1A is a schematic plan view illustrating a display apparatus according to an exemplary embodiment, and FIGS. 1B, 1C, and 1D are schematic perspective views illustrating various display apparatuses 1000a, 1000b, 1000c, and 1000d according to an exemplary embodiment.

Referring to FIG. 1A, a display apparatus 10000 may include a panel substrate 2100 and a plurality of pixel modules 1000.

The display apparatus 10000 is not particularly limited, but may include a smart watch 1000a, a wearable display apparatus 1000b such as a VR headset or glasses, an AR display apparatus 1000c such as augmented reality glasses, or an indoor or outdoor display apparatus 1000d or 1000e such as a micro LED TV or signage. The panel substrate 2100 and the plurality of pixel modules 1000 may be disposed in the display apparatus 10000. A gap between pixels in the display apparatus 10000 may be very narrow, for example, the gap between pixels may be 0.01 mm or less. The display apparatus 10000 may implement an image through pixels mounted on a circuit board or a transparent substrate. In some display apparatuses, a distance between the display apparatus and an external receiver (e.g., a user's eyes) that recognizes the display may be 200 mm or less. The gap between pixels may be 0.005% to 0.1% of the distance between the external receiver and the display apparatus. The display apparatus 10000 may transmit an optical signal from a substrate including a curved surface to the external receiver. The display apparatus 10000 may also be a transparent display apparatus using a transparent substrate.

The panel substrate 2100 may include a circuit for a passive matrix driving or active matrix driving. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the circuit disposed on an upper surface thereof.

In an exemplary embodiment, the plurality of pixel modules 1000 is arranged on the panel substrate 2100. Each of the pixel modules 1000 may include a circuit board 1001, and a plurality of light emitting devices 100 disposed on the circuit board 1001, and may include a molding member covering the light emitting devices 100. In another exemplary embodiment, the plurality of light emitting devices 100 may be directly arranged on the panel substrate 2100, and the molding member may cover the light emitting devices 100.

The smart watch 1000a may have 500 to 1500 cd/m$^2$ (or nits) or more, and a brightness thereof may be adjusted according to an external illumination. The wearable display apparatus 1000b, such as a VR headset or glasses, may have 150 to 200 cd/m$^2$ (or nits), or a viewing angle thereof may be 50 degrees or more. The indoor or outdoor display apparatus 1000d or 1000e, such as Micro LED TV or signage, may have 1000 cd/m$^2$ (or nits) or more, or 80 degrees or more viewing angle, especially for outdoor use, 3000 cd/m$^2$ (or nits) or more. In the display apparatus 1000d or 1000e, a plurality of panels P1 and P2 is arranged in rows and columns and attached to a frame, and a plurality of micro LED pixels is disposed on the plurality of panels P1 and P2 to supply electricity or signals, and thus, the display apparatus may be turned on or its luminous intensity may be adjusted according to supplied electricity or signals. The plurality of panels P1 and P2 may be connected to an external power source using respective connectors, or the plurality of panels P1 and P2 may be electrically connected to one another using connectors.

FIGS. 2A, 2B, 2C, and 2D are a schematic perspective view, a plan view, and cross-sectional views illustrating a light emitting device 100 according to an exemplary embodiment, respectively.

Referring to FIGS. 2A through 2D, the light emitting device 100 may include a substrate 11 and first, second, and third sub-units 2, 3, and 4, a first connection electrode 20ce, a second connection electrode 30ce, a third connection electrode 40ce, and a fourth connection electrode 50ce formed on the first, second, and third sub-units 2, 3, and 4, and a protection layer 90 surrounding the connection electrodes 20ce, 30ce, 40ce, and 50ce. The light emitting device 100 illustrated in FIG. 2A may be formed by singularizing a plurality of light emitting device arrays formed on the substrate 11. Descriptions of formation and singulation of the light emitting devices 100 will be described later in detail. The light emitting device 100 including the first, second, and third sub-units 2, 3, and 4 may be subjected to an additional process to be formed into a light emitting module, which will also be described in detail later.

The substrate 11 may include a light-transmissive insulating material so as to transmit light. However, the inventive concepts are not limited thereto, and the substrate 11 in other exemplary embodiments may be translucent or partially transparent so as to transmit only light of a specific wavelength or only a portion of light of a specific wavelength. The substrate 11 may be a growth substrate capable of epitaxially growing a third LED stack 40, for example, a sapphire substrate. However, the substrate 11 is not limited to the sapphire substrate, and may include various other transparent insulating materials. The substrate 11 may include glass, quartz, silicone, an organic polymer, or an organic-inorganic composite material, or the like, and it may be, for example, silicon carbide (SiC), gallium nitride (GaN), indium gallium nitride (InGaN), aluminum gallium nitride (AlGaN), aluminum nitride (AlN), gallium oxide (Ga2O3), or a silicon substrate.

In addition, the substrate 11 may include a protrusion pattern P on an upper surface thereof. In more detail, the protrusion pattern P may include a plurality of protrusions protruding upward from the upper surface of the substrate 11. In an exemplary embodiment, each of the protrusions may have a circular shape in plan view. When each of the protrusions of the protrusion pattern P is provided in an ellipsoid or cone shape, a vertex portion of the ellipsoid or cone may become a center. In more detail, the protrusions of the protrusion pattern P may be formed in a shape that decreases in width toward an upper direction, and when each protrusion is cut into a plane perpendicular to the substrate 11, a cross-section of the protrusion may have a substantially semi-elliptical shape, or may have a shape close to a triangle depending on the cutting plane. However, the inventive concepts are not limited thereto, and the protrusion may be modified into various shapes, such as a polygonal shape such as pentagon, hexagon, and the like.

Each of the protrusions of the protrusion pattern P may have a diameter of about 2 μm, and an interval between the protrusions may be about 1 μm. However, the inventive concepts are not limited thereto, and the diameter of the protrusions may be smaller or larger than 2 and the interval between the protrusions may be smaller or larger than 1 μm depending on an application.

In an exemplary embodiment, the protrusion pattern P may be formed of a same material as that of the substrate 11, for example, sapphire. However, the inventive concepts are not limited thereto, and the protrusion pattern P may be formed of a material different from that of the substrate 11. The protrusion pattern P including the different materials may include a first material and a second material, and the first material and the second material may be materials having different refractive indices from each other.

For example, when the first material and the second material have different refractive indices from each other, a refractive index of the first material may be from about 1.6 to about 2.45, and a refractive index of the second material may be from about 1.3 to about 2.0. Various insulating materials having different refractive indices from each other may be used as the first and second materials. As a material having such a refractive index, for example, the first material may be sapphire, and the second material may be $SiO_x$, $SiO_xN_y$, $SiN_x$, or the like.

By including the protrusion pattern P on the upper surface of the substrate 11, it is possible to increase an extraction efficiency of light generated from the third sub-unit 4 in contact with the substrate 11. The protrusion pattern P of the substrate 11 may be employed to selectively increase a luminous intensity of the third sub-unit 4 as compared to those of the first sub-unit 2 and the second sub-unit 3. Light generated from the first, second, and third sub-units 2, 3, 4 is emitted through the substrate 11. When light generated from the first, second, and third sub-units 2, 3, and 4 passes through the substrate 11, light diffusion and light scattering by the protruding pattern P occur, and thus, a light extraction efficiency of the light emitting device 100 may be significantly increased. In addition, a ratio of light extracted in a direction perpendicular to a rear surface of the substrate 11 is increased by the protrusion pattern P, and a ratio of light extracted in a direction parallel to the rear surface of the substrate 11 is relatively decreased. Accordingly, a deviation of light extracted from the light emitting device 100, for example, blue light, red light, and green light, is reduced, and thus, it is possible to alleviate a color difference depending on viewing angles.

An area of the substrate 11 may define an area of the light emitting device 100. In an exemplary embodiment, the area of the substrate 11 may be substantially the same as that of the third sub-unit 4. The area of the substrate 11 may be about less than or equal to 60,000 $\mu m^2$, further, 30,000 $\mu m^2$, and furthermore, less than or equal to 10,000 $\mu m^2$. A thickness of the substrate 11 may be 30 $\mu m$ to 180 $\mu m$, and specifically, 30 $\mu m$ to 100 $\mu m$. In an exemplary embodiment, the area of the substrate 11 may be 225 $\mu m \times 225$ $\mu m$, and the thickness thereof may be 50 $\mu m$. As a ratio of the thickness to the area of the substrate 11 becomes smaller, a ratio of light extracted in the direction parallel to the rear surface of the substrate 11 with respect to a total light extracted from the light emitting device 100 to the outside, that is, a ratio of light extracted to side surfaces may be reduced, and a ratio of light that is extracted by passing through the direction perpendicular to the rear surface of the substrate 11 may be increased. In particular, by reducing the thickness of the substrate 11, light emitted from the third sub-unit 4 adjacent to the substrate 11 may be emitted more in the direction perpendicular to the rear surface of the substrate 11. Accordingly, it is possible to reduce the deviation of light extracted from the light emitting device 100, thereby alleviating the color difference depending on the viewing angles.

Figure 2A:
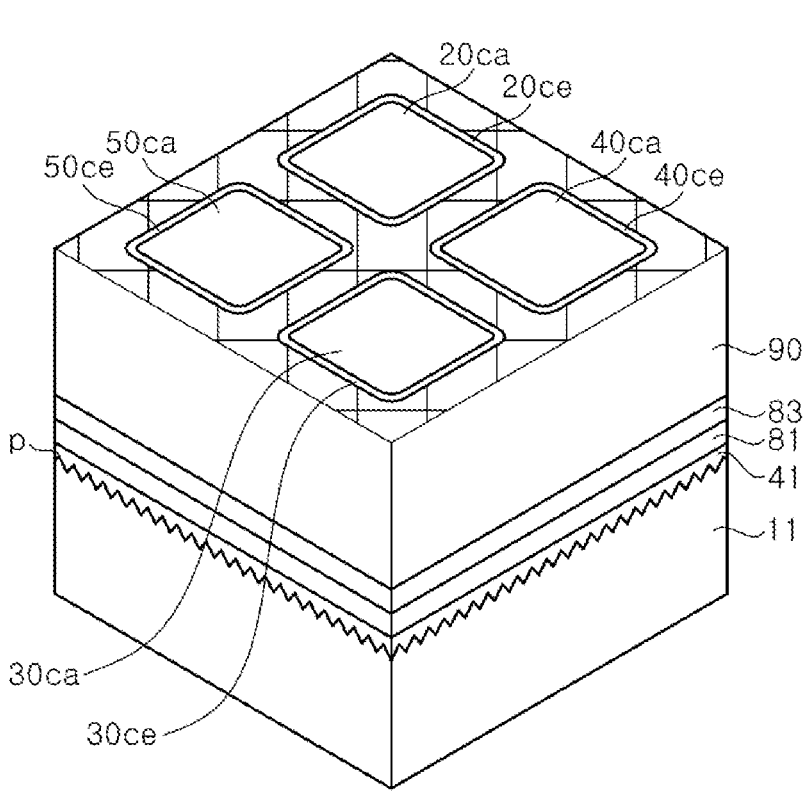
FIG. 2A is a schematic perspective view illustrating a pixel device according to an exemplary embodiment.
Figure 2B:
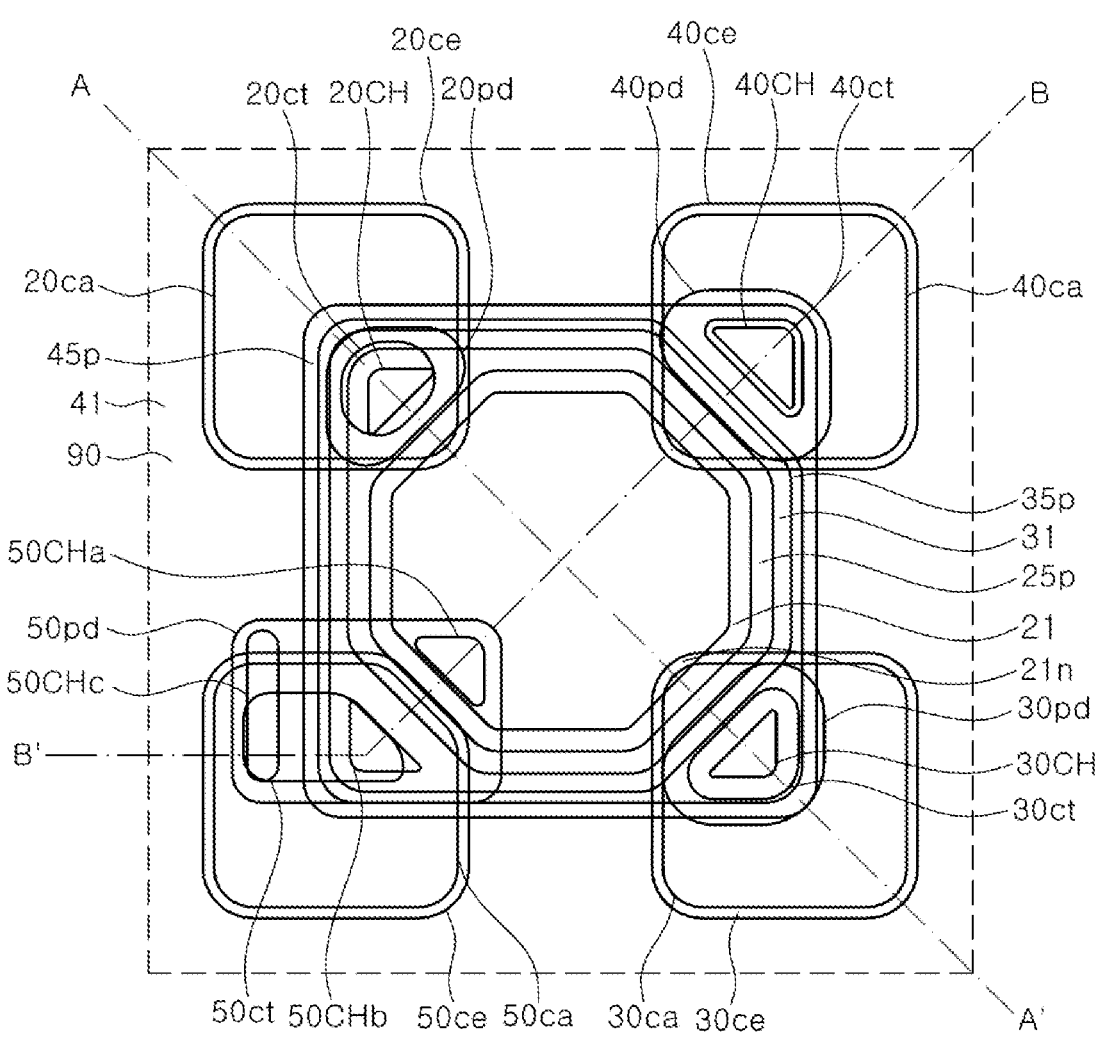
FIG. 2B is a schematic plan view illustrating a pixel device according to an exemplary embodiment.
Figure 2C:
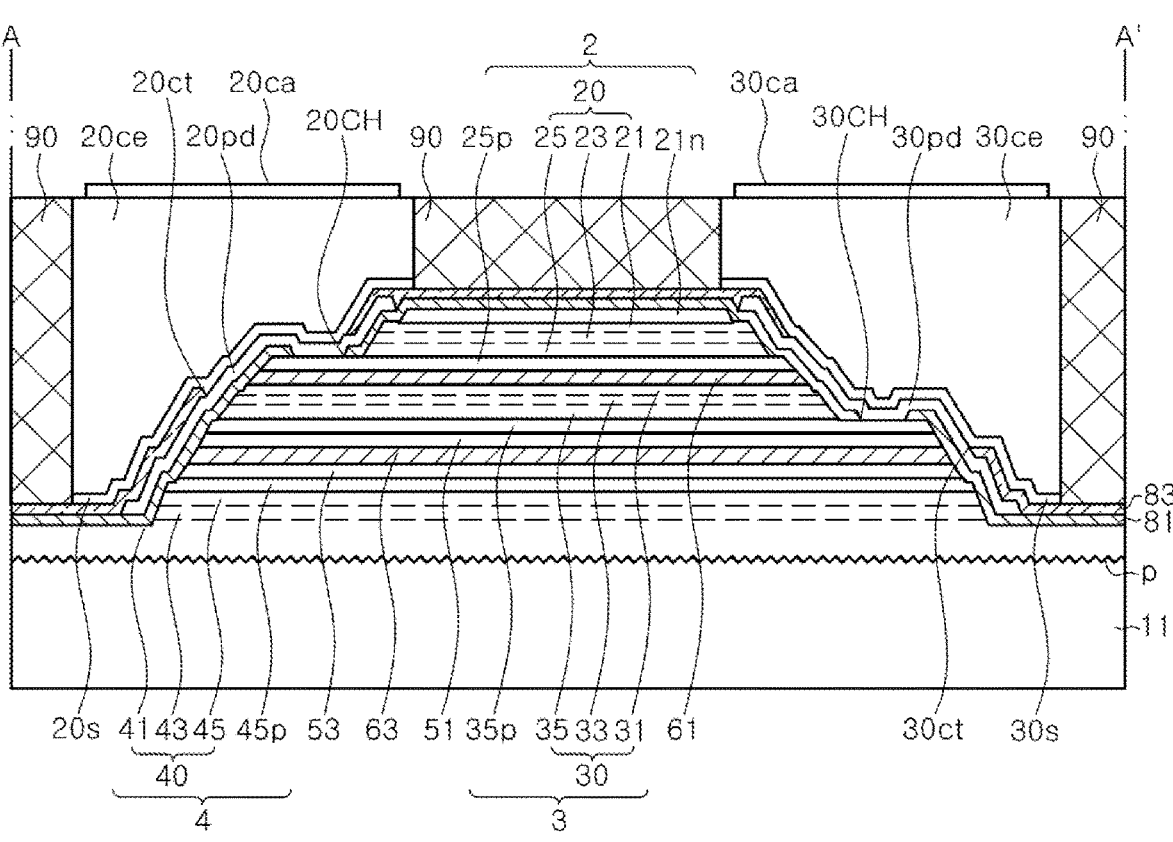
FIG. 2C is a schematic cross-sectional view taken along line A-A' of its corresponding plan view shown in FIG. 2B.
Figure 2D:
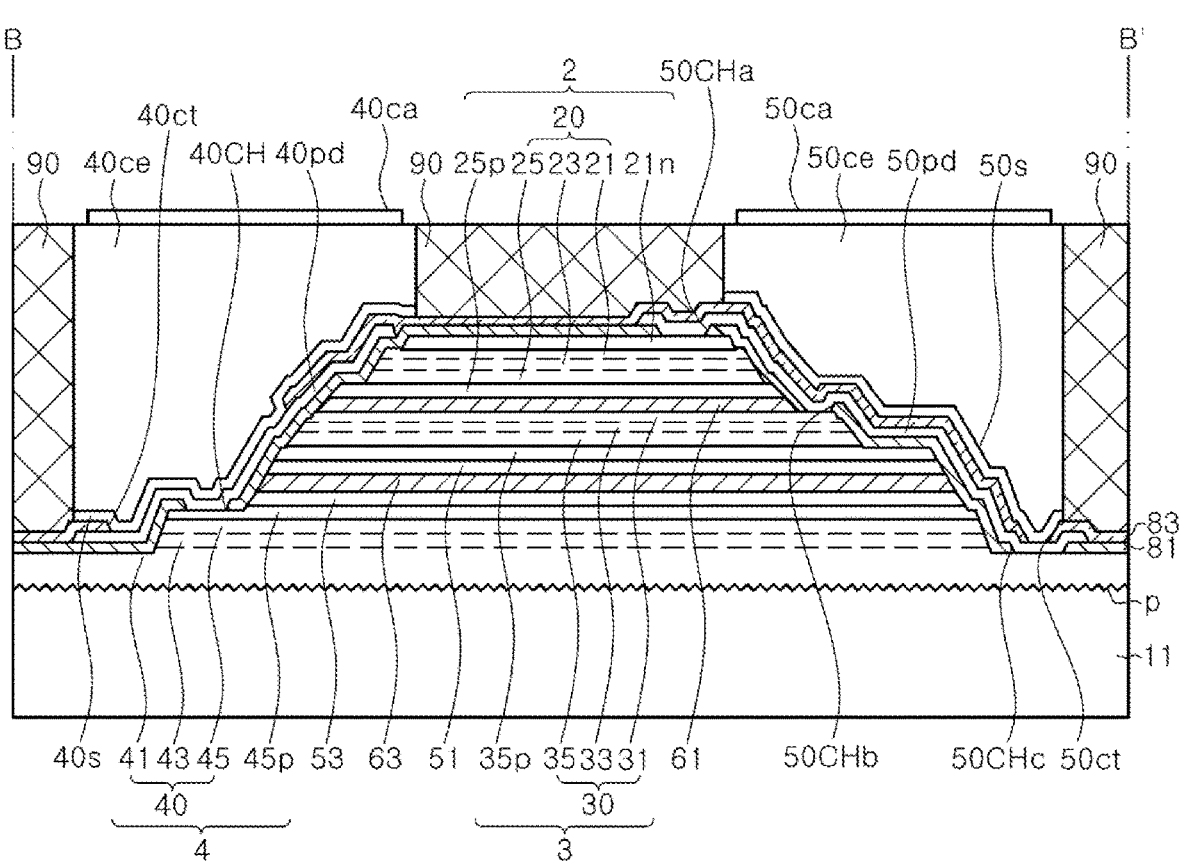
FIG. 2D is a schematic cross-sectional view taken along line B-B' of its corresponding plan view shown in FIG. 2B.

The light emitting device 100 may include the first sub-unit 2, the second sub-unit 3, and the third sub-unit 4 disposed on the substrate 11 as shown in FIG. 2C. According to an exemplary embodiment, the first, second, and third sub-units 2, 3, and 4 may emit light of different peak wavelengths from one another. Accordingly, light emitted from the first sub-unit 2 may pass through the second and third sub-units 3 and 4. In an exemplary embodiment, the sub-unit disposed farther away from the substrate 11 may emit light of a longer wavelength than that emitted from the sub-unit disposed closer to the substrate 11 to reduce light loss. For example, the first sub-unit 2 may emit light having a longer wavelength than those of the second and third sub-units 3 and 4, and the second sub-unit 3 may emit light of a longer wavelength than that of the third sub-unit 4. For example, the first sub-unit 2 may emit red light, the second sub-unit 3 may emit green light, and the third sub-unit 4 may emit blue light.

In another exemplary embodiment, to adjust a color mixing ratio of the first, second, and third sub-units 2, 3, and 4, the second sub-unit 3 may emit light of a shorter wavelength that that emitted from the third sub-unit 4. Accordingly, it is possible to reduce a luminous intensity of the second sub-unit 3, and increase a luminous intensity of the third sub-unit 4, and thus, a luminous intensity ratio of light emitted from the first, second, and third sub-units may be controlled. For example, the first sub-unit 2 may emit red light, the second sub-unit 3 may emit blue light, and the third sub-unit 4 may emit green light. Accordingly, it is possible to relatively reduce the luminous intensity of blue light, and relatively increase the luminous intensity of green light, and thus, a luminous intensity ratio of red light, green light, and blue light may be easily adjusted to be close to 3:6:1. Emission areas of the first, second, and third sub-units 2, 3, and 4 may be about less than or equal to 10,000 $\mu m^2$, specifically, 4,000 $\mu m^2$, and more specifically, less than or equal to 2,500 $\mu m^2$. In addition, the closer to the substrate 11, the larger the emission area may be, and the luminous intensity of green light may be further increased by disposing the third sub-unit 4 emitting green light closest to the substrate 11. Although the drawings show the light emitting device including three sub-units 2, 3, and 4, the inventive concepts are not limited to a particular number of sub-units. For example, in some exemplary embodiments, the light emitting device may include two or more sub-units therein. Herein, it will be exemplarily described that the light emitting device 100 includes three sub-units 2, 3, and 4 according to an exemplary embodiment.

Hereinafter, it is exemplarily described that the second sub-unit 3 emits light of the shorter wavelength than that of the third sub-unit 4, for example, blue light, but the second sub-unit 3 may emit light of the longer wavelength than that of the third sub-unit 4, for example, green light.

The first sub-unit 2 may include a first LED stack 20, a first upper contact electrode 21n, and a first lower contact electrode 25p.

The first LED stack 20 may include a first conductivity type semiconductor layer 21, an active layer 23, and a second conductivity type semiconductor layer 25. According to an exemplary embodiment, the first LED stack 20 may include, for example, a semiconductor material emitting red light, such as AlGaAs, GaAsP, AlGaInP, and GaP, without being limited thereto.

The first upper contact electrode 21n may be disposed on the first conductivity type semiconductor layer 21, and may form an ohmic contact with the first conductivity type semiconductor layer 21. The first lower contact electrode 25p may be disposed under the second conductivity type semiconductor layer 25. According to an exemplary embodiment, a portion of the first conductivity type semiconductor layer 21 may be patterned, and the first upper contact electrode 21n may be disposed in a patterned region of the first conductivity type semiconductor layer 21 so as to further facilitate an ohmic contact. The first upper contact electrode 21n may have a single-layered structure or a multi-layered structure, and may include Al, Ti, Cr, Ni, Au, Ag, Sn, W, Cu, or an alloy thereof, for example, Au—Te alloy or an Au—Ge alloy, without being limited thereto. In an exemplary embodiment, the first upper contact electrode 21n may have a thickness of, for example, about 100 nm, and may include metal having high reflectance so as to reflect light in a downward direction toward the substrate 11.

The first lower contact electrode 25p may be in ohmic contact with the second conductivity type semiconductor layer 25 of the first LED stack 20, and may be disposed under the second conductivity type semiconductor layer 25.

The second sub-unit 3 may include a second LED stack 30 and a second lower contact electrode 35p.

The second LED stack 30 may include a first conductivity type semiconductor layer 31, an active layer 33, and a second conductivity type semiconductor layer 35. According to an exemplary embodiment, the second LED stack 30 may include a semiconductor material that emits blue light, such as GaN, InGaN, ZnSe, or the like, without being limited thereto. The second lower contact electrode 35p may be disposed under the second conductivity type semiconductor layer 35 of the second LED stack 30, and may be in ohmic contact with the second conductivity type semiconductor layer 35.

The third sub-unit 4 may include a third LED stack 40 and a third lower contact electrode 45p.

The third LED stack 40 may include a first conductivity type semiconductor layer 41, an active layer 43, and a second conductivity type semiconductor layer 45. According to an exemplary embodiment, the third LED stack 40 may include a semiconductor material that emits green light, such as GaN, InGaN, GaP, AlGaInP, AlGaP, or the like. The third lower contact electrode 45p may be disposed under the second conductivity type semiconductor layer 45 of the third LED stack 40, and may be in ohmic contact with the second conductivity type semiconductor layer 45.

According to an exemplary embodiment, each of the first conductivity type semiconductor layers 21, 31, and 41 and the second conductivity type semiconductor layers 25, 35, and 45 of the first, second, and third LED stacks 20, 30, and 40 may have a single-layer structure or a multi-layer structure, and in some exemplary embodiments, may include a superlattice layer. Moreover, the active layers 23, 33, and 43 of the first, second, and third LED stacks 20, 30, and 40 may have single quantum well structures or multiple quantum well structures.

A total thickness from the first sub-unit 2 to the third sub-unit 4 including the first, second, and third LED stacks 20, 30, and 40 may be, for example, about 10 μm to about 30 μm. Preferably, it may be about 15 μm to about 25 μm, and more preferably, about 18 μm to about 22 μm, but the inventive concepts are not limited thereto. In general, the substrate 11 is thicker than the total thickness of the first, second, and third sub-units 2, 3, and 4. In an exemplary embodiment, a ratio of the thickness of the substrate 11 to the thickness of the first, second, and third sub-units 2, 3, and 4 may be in a range of 1.5:1 to 6:1, and further, 1.5:1 to 4:1, furthermore, 2.27:1 to 2.78:1. As the thickness ratio decreases, that is, as the thickness of the substrate 11 with respect to the thickness of the first, second, and third sub-units 2, 3, and 4 decreases, with respect to light emitted to the outside of the light emitting device 100, a ratio of light extracted to the side surface of the substrate 11 is reduced, and a ratio of light extracted through the substrate 11 in the direction perpendicular to the rear surface of the substrate 11 increases. Accordingly, it is possible to reduce a difference between radiation patterns of light extracted from the light emitting device 100, thereby alleviating the color difference depending on the viewing angles.

The thickness of the substrate 11 may be greater than the thickness including the first, second, and third LED stacks 20, 30, and 40, or may be greater than a thickness of a partial region of the protection layer 90 disposed between connection electrodes 20ce, 30ce, 40ce, and 50ce and formed in a region vertically overlapped with the first, second, and third LED stacks 20, 30, and 40. In addition, the thickness of the substrate 11 may be smaller than a thickness of a portion of the protection layer 90 surrounding an outermost side of the connection electrodes 20ce, 30ce, 40ce, and 50ce. Through this, it is possible to effectively improve the deviation of light depending on the viewing angle.

Each of the first, second, and third lower contact electrodes 25p, 35p, and 45p may include a transparent conductive material to transmit light. For example, the lower contact electrodes 25p, 35p, and 45p may be transparent conductive oxide (TCO), and the transparent conductive oxide (TCO) may include SnO, InO₂, ZnO, ITO, ITZO, or the like, without being limited thereto.

A first adhesive layer 61 may be disposed between the first LED stack 20 and the second LED stack 30, and a second adhesive layer 63 may be disposed between the second LED stack 30 and the third LED stack 40. The first and second adhesive layers 61 and 63 may include a non-conductive material that transmits light. The first and second adhesive layers 61 and 63 may include an optically clear adhesive (OCA), which, for example, may include epoxy, polyimide, SUB, spin-on-glass (SOG), benzocyclobutene (BCB), without being limited thereto.

A first stress relief layer 51 may be disposed over the second adhesive layer 63, and may be positioned between the second adhesive layer 63 and the second LED stack 30. The second stress relief layer 53 may be disposed under the second adhesive layer 63, and may be positioned between the second adhesive layer 63 and the third LED stack 40. The first and second stress relief layers 51 and 53 may include an insulating material. For example, the first and second stress relief layers 51 and 53 may include an organic or inorganic insulating material, for example, polyimide, $SiO_2$, $SiN_x$, $Al_2O_3$, and the like, and for example, may be $SiO_2$, but the inventive concepts are not limited thereto. The first and second stress relief layers 51 and 53 may be positioned between the LED stacks when the first, second, and third LED stacks 20, 30, and 40 are disposed so as to be vertically overlapped. In more detail, in a process of sequentially bonding the second LED stack 30 and the first LED stack 20 on the third LED stack 40, warpage of the substrate 11 may occur, which may cause cracks between the LED stacks 20, 30, and 40. The first and second stress relief layers 51 and 53 disposed between the LED stacks 20, 30, and 40 may relieve the warpage of the substrate 11, and thus, defects such as cracks or others that may occur between the LED stacks 20, 30, and 40 may be prevented.

A first insulation layer 81 and a second insulation layer 83 may be disposed on at least portions of upper surfaces and side surfaces of the first, second, and third LED stacks 20, 30, and 40. At least one of the first and second insulation layers 81 and 83 may include various organic or inorganic insulating materials, for example, polyimide, SiO2, SiNx, Al2O3, and the like. In addition, at least one of the first and second insulation layers 81 and 83 may include a single-layer structure or a multi-layer structure, and an example of the multi-layer structure may include a distributed Bragg reflector (DBR). In an exemplary embodiment, the first insulation layer 81 may be formed of SiO2, and the second insulation layer 83 may be formed of a distributed Bragg reflector (DBR), but the inventive concepts are not limited thereto, and the first insulation layer 81 may be formed of a distributed Bragg reflector (DBR) and the second insulation layer 83 may be formed of SiO2. A thickness of the first insulation layer 81 may be within 0.4 μm, a thickness of the second insulation layer 83 may be 1.8 μm to 1.9 μm, and conversely, the thickness of the first insulation layer 81 may be 1.8 μm to 1.9 μm, and the thickness of the second insulation layer 83 may be 0.4 μm. However, the thicknesses of the first and second insulation layers 81 and 83 may vary according to a target wavelength region of light emitted from the light emitting device 100.

The distributed Bragg reflector DBR of the first insulation layer 81 or the second insulation layer 83 may include a first material layer having a first refractive index and a second material layer having a second refractive index. The first material layer may have a lower refractive index, and the second material layer may have a higher refractive index. As used herein, the "lower refractive index" and the "higher refractive index" refer to a relative difference in refractive indices with respect to the first material layer and the second material layer. In an exemplary embodiment, the first material layers may be SiO2, and the second material layers may be TiO2. A refractive index of SiO2 of the first material layer is about 1.47, and a refractive index of TiO2 is about 2.41. However, materials forming the first material layer and the second material layer are not limited to SiO2 and TiO2, and in some exemplary embodiments, the first and second material layers may be formed of Si3N4, MgF2, Nb2O5, ZnS, ZrO2, ZnO, or a compound semiconductor. However, the difference in refractive indices between the first material layer and the second material layer may be greater than 0.5.

The distributed Bragg reflector (DBR) may be formed by repeatedly stacking a pair of the first material layer and the second material layer a plurality of times. In general, material layers having a higher refractive index have a higher absorption rate than material layers having a lower refractive index. Accordingly, controlling an optical thickness of the second material layers having the higher refractive index to be smaller than an optical thickness of the first material layers having the lower refractive index may reduce light loss due to light absorption. Accordingly, each thickness of the SiO2, which is the first material layer, may be formed greater than each thickness of the TiO2, which is the second material layer.

In addition, a first layer and a last layer of the distributed Bragg reflector (DBR) may be SiO2. By using the SiO2 as the first layer of the distributed Bragg reflector (DBR), adhesion with the first insulation layer 81 may be enhanced, and further, by using SiO2 which is the last layer, the distribution Bragg reflector (DBR) may be protected, and adhesion between the protection layer 90 and the connection electrodes 20ce, 30ce, 40ce, and 50ce, which will be described later, may be enhanced.

According to an exemplary embodiment, the distributed Bragg reflector (DBR) applied to the second insulation layer 83 may have a reflectance of 95% or more over a wavelength range of 400 to 650 nm, and thus, light emitted from the light emitting device 100 and incident may be reflected with a high reflectance. The distributed Bragg reflector (DBR) may be formed of, for example, 21 layers, without being limited thereto. For example, the distributed Bragg reflector (DBR) may include 41 layers including the first material layer and the second material layer, and may have a thickness of 3 μm to 5 μm. The distributed Bragg reflector (DBR) may exhibit a reflectance of 90% or more over a wavelength range of 410 nm to 700 nm.

The second insulation layer 83 may improve light extraction efficiency by reflecting light emitted from the first, second, and third LED stacks 20, 30, and 40. In addition, by a multilayer distributed Bragg reflector (DBR), a cavity of light may be formed to improve a straightness of extracted light, and the color difference depending on the viewing angles may be alleviated by reducing the deviation of the radiation patterns of blue light, green light, and red light.

In addition, the first insulation layer 81 may be etched so as to form contact holes 20CH, 30CH, 40CH, and 50CH, which will be described later. The first insulation layer 81 is formed of a single layer of SiO2 so that an etching process may be carried out smoothly. Accordingly, it is possible to secure a uniform thickness without damaging the lower contact electrodes 25p, 35p, and 45p on a lower surface thereof, thereby stably maintaining electrical characteristics. In addition, the distributed Bragg reflector (DBR) of the second insulation layer 83 may cause diffused reflection of light extracted to side surfaces of the first, second, and third sub-units 2, 3, and 4, thereby improving light extraction efficiency of light.

When the first insulation layer 81 is formed of a dielectric layer having the lower refractive index, such as $SiO_2$, the first insulation layer 81 may constitute an omni-directional reflector together with the first through third LED stacks 20, 30, and 40 and electrode pads 20pd, 30pc, 40pd, and 50pd covering the first insulation layer 81.

In another exemplary embodiment, the first insulation layer 81 may be formed of a distributed Bragg reflector (DBR), and the second insulation layer 83 may be formed of a single layer, for example, $SiO_2$. The distributed Bragg reflector (DBR) of the first insulation layer 81 may be formed in a laminated structure of, for example, $SiO_2/TiO_2$, and may have a thickness of 1.8 μm to 1.9 μm. The second insulation layer 83 is formed of $SiO_2$, and may have a thickness of 0.4 μm.

In another exemplary embodiment, both of the first and second insulation layers 81 and 83 may be formed of distributed Bragg reflectors (DBRs). In an exemplary embodiment, the first and second insulation layers 81 and 83 may have high overall reflectance in a wide wavelength band of visible light. In another exemplary embodiment, the first insulation layer 81 and the second insulation layer 83 may have high reflectance in different wavelength bands from each other. For example, the first insulation layer 81 has a high reflectance in a wavelength range of light emitted from any one or two LED stacks of the first, second, and third LED stacks 20, 30, and 40, and the second insulation layer 83 may have a high reflectance in a wavelength band of light emitted from the remaining LED stacks. Since the first and second insulation layers 81 and 83 are formed to have high reflectance selectively in specific wavelength bands, a stacked structure of each of the first and second insulation layers 81 and 83 may be simplified while the light reflectance may be secured. However, the inventive concepts are not limited thereto, and the materials, the thicknesses, and the structures of the first and second insulation layers 81 and 83 may be varied depending on the wavelength region of light emitted from the light emitting device 100.

Each of the first, second, and third LED stacks 20, 30, and 40 may be driven independently. In an exemplary embodiment, a common voltage may be applied to the first conductivity type semiconductor layers 21, 31, and 41 of the first, second, and third LED stacks 20, 30 and 40, and individual light emitting signals may be applied to each of the second conductivity type semiconductor layers 25, 35, and 45. In another exemplary embodiment, the individual light emitting signals may be applied to each of the first conductivity type semiconductor layers 21, 31, and 41 of the first, second, and third LED stacks 20, 30 and 40, and the common voltage may be applied to the second conductivity type semiconductor layers 25, 35, and 45. For example, the first conductivity type semiconductor layers 21, 31, and 41 of each LED stack 20, 30, or 40 may be n-type, and the second conductivity type semiconductor layers 25, 35, and 45 may be p-type. In this case, the common voltage may be applied to the first conductivity type semiconductor layers 21, 31, and 41, and the individual light emitting signals may be applied to each of the second conductivity type semiconductor layers 25, 35 and 45, or vice versa. When the first, second, and third LED stacks 20, 30, and 40 are vertically stacked, the third LED stack 40 may have a reversed stacked sequence as compared to those of the first and second LED stacks 20 and 30. In particular, the second conductivity type semiconductor layer 45 of the third LED stack 40, for example, a p-type semiconductor layer 45 may be disposed over the active layer 43, and the second conductivity type semiconductor layer 35 of the second LED stack 30 may be disposed under the active layer 33. By making the stacked sequence of the third LED stack 40 reverse to the stacked sequence of the second LED stack 30, a manufacturing process of the light emitting device 100 may be simplified. In the illustrated exemplary embodiment, the first conductivity type semiconductor layer and the second conductivity type semiconductor layer are described as n-type and p-type, respectively, but the inventive concepts are not limited thereto, and can be formed vice versa.

According to the illustrated exemplary embodiment, the light emitting device 100 may include a first electrode pad 20pd, a second electrode pad 30pd, a third electrode pad 40pd, and a fourth electrode pad 50pd. The second conductivity type semiconductor layers 25, 35, and 45 of the LED stacks 20, 30 and 40 may be respectively connected to the first electrode pad 20pd, the second electrode pad 30pd, and the third electrode pad 40pd to receive a corresponding light emitting signal, respectively. Meanwhile, the first conductivity type semiconductor layers 21, 31, and 41 of the LED stacks 20, 30, and 40 may be connected to the fourth electrode pad 50pd to receive a common voltage from the outside. In this way, each of the first, second, and third LED stacks 20, 30, and 40 may be driven independently while having a common n-type electrode to which the common voltage is applied, but the inventive concepts are not limited thereto.

The first electrode pad 20pd may be connected to the first lower contact electrode 25p through a first contact hole 20CH defined through the first insulation layer 81, and may also be electrically connected to the second conductivity type semiconductor layer 25. The first electrode pad 20pd may be disposed between the first insulation layer 81 and the second insulation layer 83 to have at least a partial overlapping area therewith.

The second electrode pad 30pd may be connected to the second lower contact electrode 35p through a second contact hole 30CH defined through the first insulation layer 81, and may also be electrically connected to the second conductivity type semiconductor layer 35. The second electrode pad 30pd may be disposed between the first insulation layer 81 and the second insulation layer 83 to have at least a partial overlapping region therewith.

The third electrode pad 40pd may be connected to the third lower contact electrode 45p through a third contact hole 40CH defined through the first insulation layer 81, and may also be electrically connected to the second conductivity type semiconductor layer 45. The third electrode pad 40pd may be disposed between the first insulation layer 81 and the second insulation layer 83 to have at least a partial overlapping area therewith.

The fourth electrode pad 50pd may be electrically connected to the first conductivity type semiconductor layers 21, 31, and 41 of the first, second, and third LED stacks 20, 30, and 40 through a first sub-contact hole 50 CHa, a second sub-contact hole 50CHb, and a third sub-contact hole 50CHc defined through the first insulation layer 81 on the first conductivity type semiconductor layers 21, 31, and 41 of the first, second, and third LED stacks 20, 30, and 40. In more detail, the fourth electrode pad 50pd may be electrically connected to the first conductivity type semiconductor layer 21 of the first LED stack 20 through the first sub-contact hole 50CHa, may be electrically connected to the first conductivity type semiconductor layer 31 of the second LED stack 30 through the second sub-contact hole 50CHb, and may be electrically connected to the first conductivity type semiconductor layer 41 of the third LED stack 40 through the third sub-contact hole 50CHc.

According to an exemplary embodiment, the electrode pads 20pd, 30pd, 40pd, and 50pd may be formed at various positions. For example, as shown in FIG. 2B, when the light emitting device 100 has a substantially square shape, the electrode pads 20pd, 30pd, 40pd, and 50pd may be disposed around each corner of the square shape. However, the inventive concepts are not limited thereto, and the light emitting device 100 may be formed in various shapes, and the electrode pads 20pd, 30pd, 40pd, and 50pd may be formed at different positions depending on the shape of the light emitting device.

The first, second, third, and fourth electrode pads 20pd, 30pd, 40pd, and 50pd are spaced apart from one another, and may be insulated from one another. According to an exemplary embodiment, each of the first, second, third, and fourth electrode pads 20pd, 30pd, 40pd, and 50pd may cover at least portions of the side surfaces of the first, second, and third LED stacks 20, 30, and 40.

The first through fourth connection electrodes 20ce, 30ce, 40ce, and 50ce may be formed to have an elongated shape in a vertical direction from the substrate 11. The first connection electrode 20ce may be electrically connected to the first electrode pad 20pd through a first through hole 20ct defined through the second insulation layer 83. The second connection electrode 30ce may be electrically connected to the second electrode pad 30pd through a second through hole 30ct defined through the second insulation layer 83. The third connection electrode 40ce may be electrically connected to the third electrode pad 40pd through a third through hole 40ct defined through the second insulation layer 83. The fourth connection electrode 50ce may be electrically connected to the fourth electrode pad 50pd through a fourth through hole 50ct defined through the second insulation layer 83.

The first through fourth connection electrodes 20ce, 30ce, 40ce, and 50ce may include metal, such as Cu, Ni, Ti, Sb, Mo, Co, Sn, Ag, or an alloy thereof, without being limited thereto. For example, each of the connection electrodes 20ce, 30ce, 40ce, and 50ce may include two or more metals or a plurality of different metal layers so as to reduce stress due to the elongated shapes of the connection electrodes 20ce, 30ce, 40ce, and 50ce. When the first through fourth connection electrodes 20ce, 30ce, 40ce, and 50ce include Cu, an additional metal may be formed so as to suppress an oxidation of Cu. In addition, the first through fourth connection electrodes 20ce, 30ce, 40ce, and 50ce may include Cu/Ni/Sn, and in this case, Cu may prevent Sn from infiltrating into the light emitting device 100, and in addition, heat generated from the light emitting device 100 may be easily dissipated to the outside due to favorable thermal conductivity of Cu.

The first through fourth connection electrodes 20ce, 30ce, 40ce, and 50ce may further include seed layers 20s, 30s, 40s, and 50s for forming a metal layer during a plating process. The seed layers 20s, 30s, 40s, and 50s may be formed of, for example, a plurality of Ti/Cu layers.

The first through fourth connection electrodes 20ce, 30ce, 40ce, and 50ce may have a flat upper surface, which may facilitate electrical connection between an external line or circuit electrode with the first, second, and third LED stacks. According to an exemplary embodiment, when the light emitting device 100 includes a micro LED having a surface area of less than 10,000 $\mu m^2$, specifically less than 4,000 $\mu m^2$ or 2,500 $\mu m^2$, the first through fourth connection electrodes 20ce, 30ce, 40ce, and 50ce may be overlapped with a portion of at least one of the first, second, and third LED stacks 20, 30, and 40. In more detail, the first through fourth connection electrodes 20ce, 30ce, 40ce, and 50ce may be overlapped with at least one step formed on the side surfaces of the first, second, and third LED stacks 20, 30, and 40. As such, since contact areas of lower surfaces of the first through fourth connection electrodes 20ce, 30ce, 40ce, and 50ce are larger than those of upper surfaces, a larger contact area may be formed between the first through fourth connection electrodes 20ce, 30ce, 40ce, and 50ce and the first, second, and third LED stacks 20, 30, and 40. Accordingly, the first through fourth connection electrodes 20ce, 30ce, 40ce, and 50ce may be formed more stably on the first, second, and third sub-units 2, 3, and 4. In addition, the connection electrodes 20ce, 30ce, 40ce, and 50ce connected to the electrode pads 20pd, 30pd, 40pd, and 50pd occupy most area of the light emitting device 100, and thus, it is possible to easily dissipate heat generated in the light emitting device. The connection electrodes 20ce, 30ce, 40ce, and 50ce may also efficiently dissipate heat generated from the light emitting device 100 to the outside through a shortest path.

According to an exemplary embodiment, the protection layer 90 may be formed on the first, second, and third sub-units 2, 3, and 4. In more detail, as shown in FIG. 2A, the protection layer 90 is formed between the first through fourth connection electrodes 20ce, 30ce, 40ce, and 50ce, and may cover side surfaces of at least portions of the first, second, and third sub-units 2, 3, and 4 and side surfaces of the first through fourth connection electrodes 20ce, 30ce, 40ce, and 50ce. As illustrated, the protection layer 90 may expose side surfaces of the substrate 11, the first and second insulation layers 81 and 83, and the third LED stack 40. The protection layer 90 may be formed flush with upper surfaces of the first through fourth connection electrodes 20ce, 30ce, 40ce, and 50ce, and may include an epoxy molding compound (EMC) or the like. The protection layer 90 may be transparent, or may be formed in various colors, such as black, white, or others. The protection layer 90 may include polyimide (PID), and the polyimide (PID) may be provided as a dry film rather than a liquid so as to increase flatness when applied to the first, second, and third sub-units 2, 3 and 4. In addition, the protection layer 90 may include a material having photosensitivity. Accordingly, the protection layer 90 may not only protect the first, second, and third sub-units 2, 3, and 4 from external impacts that may be applied during a subsequent process, but also provide a sufficient contact area for the light emitting device 100 to facilitate its handling during a subsequent transferring step. In addition, the protection layer 90 may prevent light leakage to the side surface of the light emitting device 100, thereby preventing or suppressing interference of light emitted from an adjacent light emitting device 100.

Protection metal layers 20ca, 30ca, 40ca, and 50ca may be further formed on the connection electrodes 20ce, 30ce, 40ce, and 50ce. The protection metal layers 20ca, 30ca, 40ca, and 50ca may be a plurality of multi-layered metal layers, and may include Ti/Ni/Au, but the inventive concepts are not limited thereto. The protection metal layers 20ca, 30ca, 40ca, and 50ca may be formed on the upper surfaces of the first through fourth connection electrodes 20ce, 30ce, 40ce, and 50ce, and may be formed to have narrower widths than those of the first through fourth connection electrodes 20ce, 30ce, 40ce, and 50ce. Accordingly, surface areas of the protection metal layers 20ca, 30ca, 40ca, and 50ca may be smaller than those of the first through fourth connection electrodes 20ce, 30ce, 40ce, and 50ce. However, the inventive concepts are not limited thereto, and the protection metal layers 20ca, 30ca, 40ca, and 50ca may be formed to have the same or wider widths than those of the first through fourth connection electrodes 20ce, 30ce, 40ce, and 50ce, and accordingly, a larger surface area may be formed.

A plurality of light emitting devices 100 may be formed in an array on the substrate 11. The substrate 11 may be cut along a scribing line to be separated into individual light emitting devices 100, and the light emitting device 100 may be transferred to a substrate or a tape using various transferring techniques for subsequent processes, such as packaging or modularization.

Hereinafter, a method of manufacturing the light emitting device 100 according to an exemplary embodiment will be described. The contents described in the above-described exemplary embodiment will be briefly described or omitted.

FIGS. 3A, 4A, 5A, 6A, 7A, and 8A are plan views illustrating a process of manufacturing the light emitting device of FIG. 2A according to an exemplary embodiment. FIGS. 3B, 4B, 5B, 6B, 7B, and 8B are cross-sectional views taken along line C-C' of its corresponding plan view shown in FIGS. 3A, 4A, 5A, 6A, 7A, and 8A, respectively.

The substrate 11 may include a protrusion pattern P, for example, a patterned sapphire substrate. The first conductivity type semiconductor layer 41, the active layer 43, and the second conductivity type semiconductor layer 45 including the third LED stack 40 may be sequentially grown on the substrate 11 by, for example, a metal organic chemical vapor deposition (MOCVD) method or a molecular beam epitaxy (MBE) method. The third lower contact electrode 45p may be formed on the second conductivity type semiconductor layer 45 by, for example, a physical vapor deposition method or a chemical vapor deposition method, and may include a transparent conductive oxide (TCO), such as SnO, $InO_2$, ZnO, ITO, ITZO, or the like. Furthermore, a first stress relief layer 51 may be formed on the third lower contact electrode 45p. The first adhesion enhancement layer 51 may be formed of, for example, $SiO_2$. According to an exemplary embodiment, the third LED stack 40 may emit green light.

The first and second LED stacks 20 and 30 may be formed similarly by sequentially growing the first conductivity type semiconductor layers 21 and 31, the active layers 23 and 33, and the second conductivity type semiconductor layers 25 and 35 on a temporary substrate, respectively. The first and second lower contact electrodes 25p and 35p including the transparent conductive oxide (TCO) may be formed on the second conductivity type semiconductor layers 25 and 35, respectively, by, for example, the physical vapor deposition method or the chemical vapor deposition method. Furthermore, the second stress relief layer 53 may be formed on the second lower contact electrode 35p. The second stress relief layer 53 may be formed of, for example, $SiO_2$.

The second and third LED stacks 30 and 40 are coupled to each other with the second adhesive layer 63 interposed therebetween, and the temporary substrate of the second LED stack 30 may be removed by a laser lift-off process, a chemical process, a mechanical process, and the like. In addition, the first LED stack 20 may be coupled to the second LED stack 30 with the first adhesive layer 61 interposed therebetween, and the temporary substrate of the first LED stack 20 may be removed by the laser lift-off process, the chemical process, the mechanical process, and the like.

In the above course, warpage may occur in the substrate 11 due to a difference in thermal expansion coefficients between the LED stacks 20, 30, and 40 while adhering the different LED stacks 20, 30, and 40 to one another and separating the temporary substrates of the first and second LED stacks 20 and 30, and thus, cracks may be generated between the LED stacks 20, 30, and 40. However, by disposing the first and second stress relief layers 51 and 53 between the LED stacks 20, 30, and 40, defects such as cracks in the LED stacks 20, 30, and 40 may be prevented.

Figure 3A:
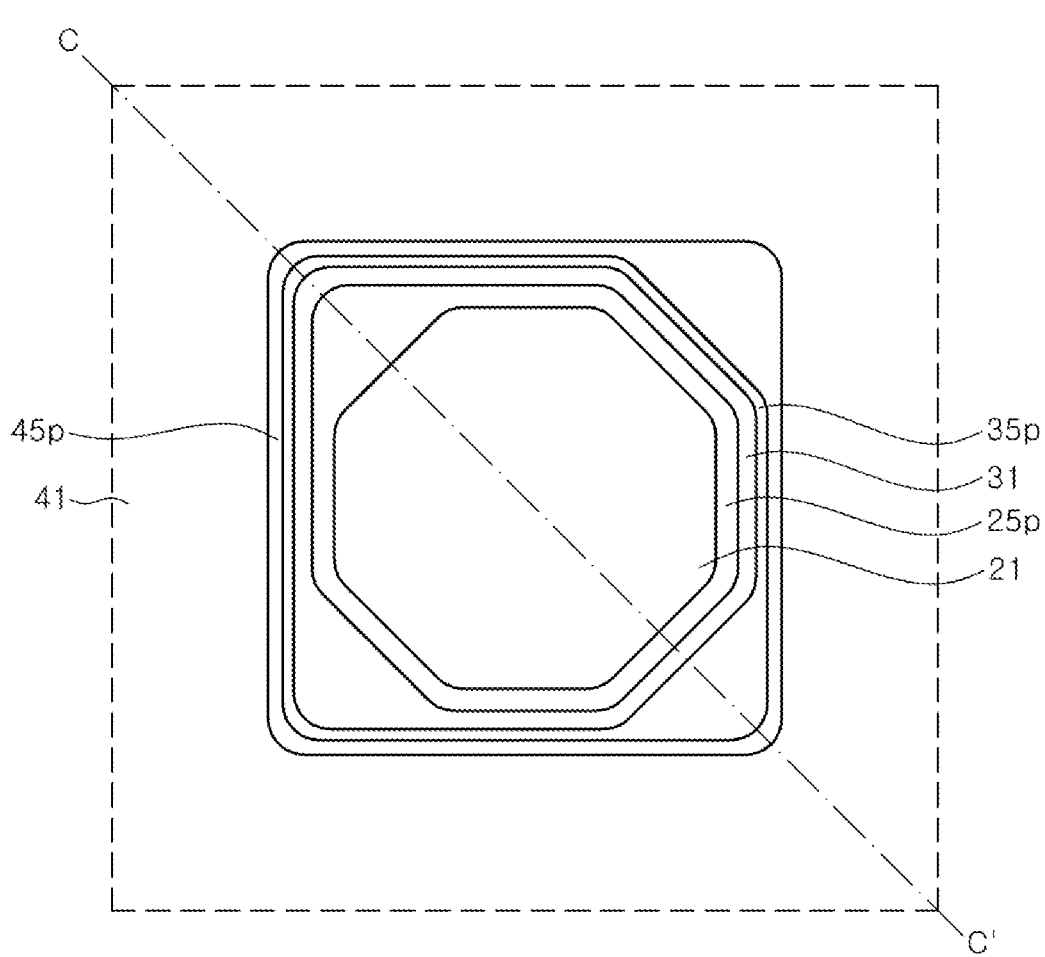
FIGS. 3A, 4A, 5A, 6A, 7A, and 8A are schematic plan views illustrating a method of manufacturing a light emitting device according to an exemplary embodiment.
Figure 3B:
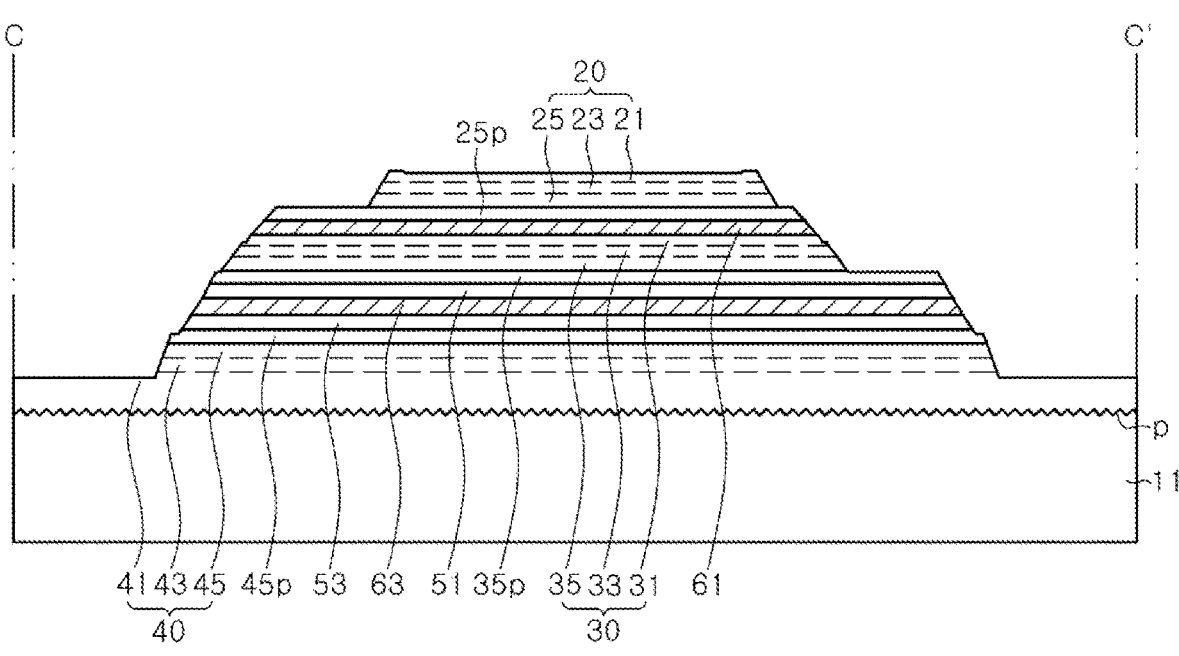
FIGS. 3B, 4B, 5B, 6B, 7B, and 8B are cross-sectional views taken along line C-C' of its corresponding plan view shown in FIGS. 3A, 4A, 5A, 6A, 7A, and 8A, respectively.

Referring to FIGS. 3A and 3B, various portions of each of the first, second, and third LED stacks 20, 30, and 40 are patterned through an etching process, or the like, so that at least a portion of the first conductivity type semiconductor layer 21 of the first LED stack 20, the first lower contact electrode 25p, the first conductivity type semiconductor layer 31 of the second LED stack 30, the second lower contact electrode 35, the third lower contact electrode 45p, and the first conductivity type semiconductor layer 41 of the third LED stack 40 may be exposed.

The first LED stack 20 may have a smallest area among the LED stacks 20, 30, and 40. Meanwhile, the third LED stack 40 may have a largest area among the LED stacks 20, 30, and 40, and thus, a luminous intensity of the third LED stack 40 may be relatively increased. However, the inventive concepts are not limited thereto, and the LED stacks 20, 30, and 40 are not particularly limited to relative sizes.

Figure 4A:
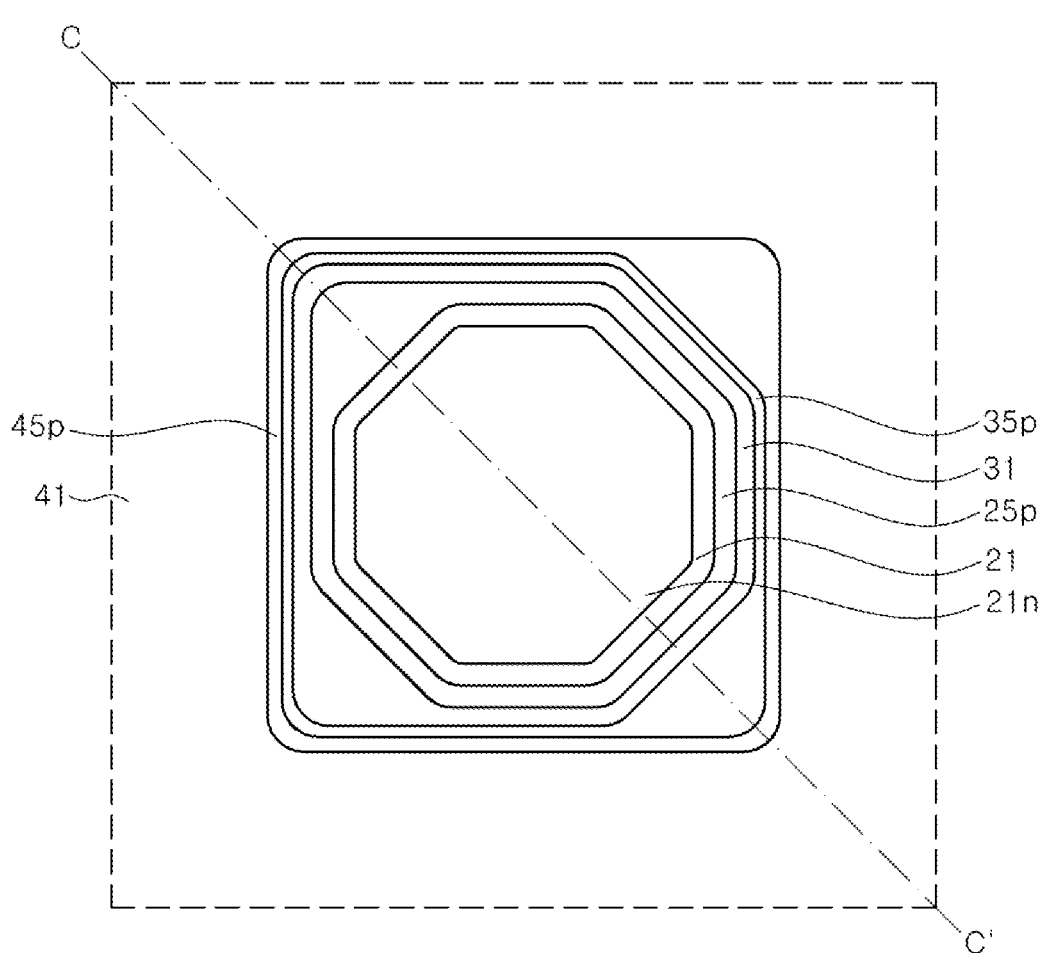
Figure 4B:
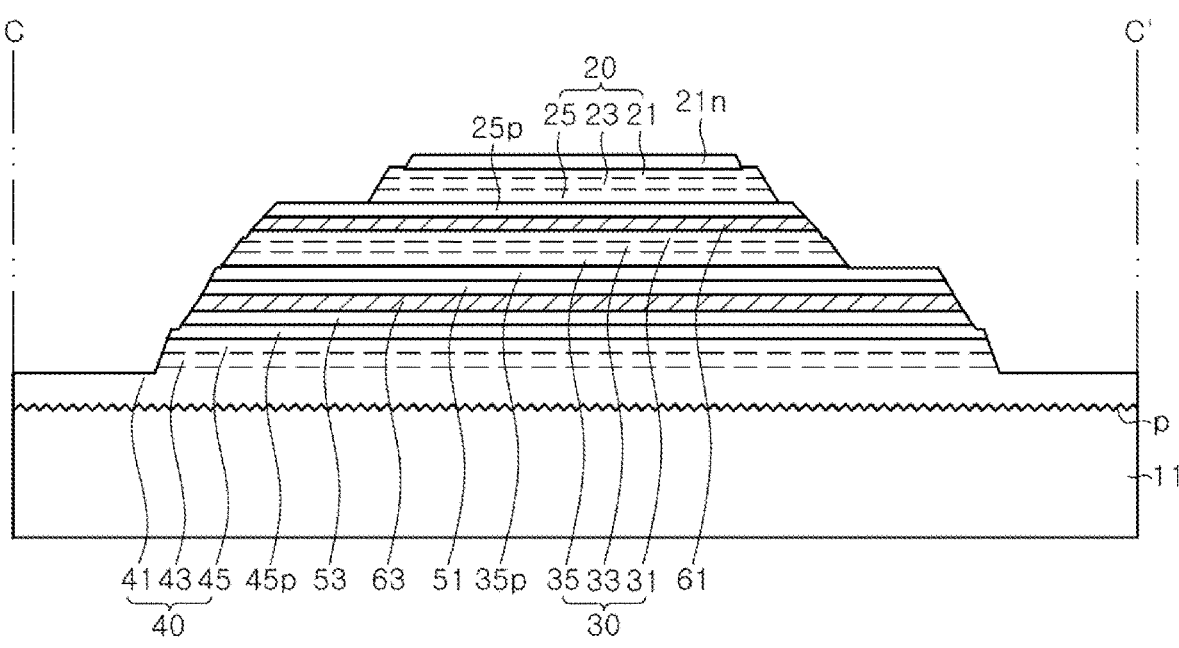

Referring to FIGS. 4A and 4B, a portion of an upper surface of the first conductivity type semiconductor layer 21 of the first LED stack 20 may be subject to a surface treatment through a wet etching process so as to form the first upper contact electrode 21n. A surface-treated region may be etched to a sufficient thickness through over-etching, and accordingly, a thickness of a region in which the first upper contact electrode 21n is to be formed may be smaller than the remaining region of the first conductivity type semiconductor layer 21. The first upper contact electrode 21n may be formed to have a thickness of about 100 nm in the patterned region of the first conductivity type semiconductor layer 21, thereby improving ohmic contact.

Figure 5A:
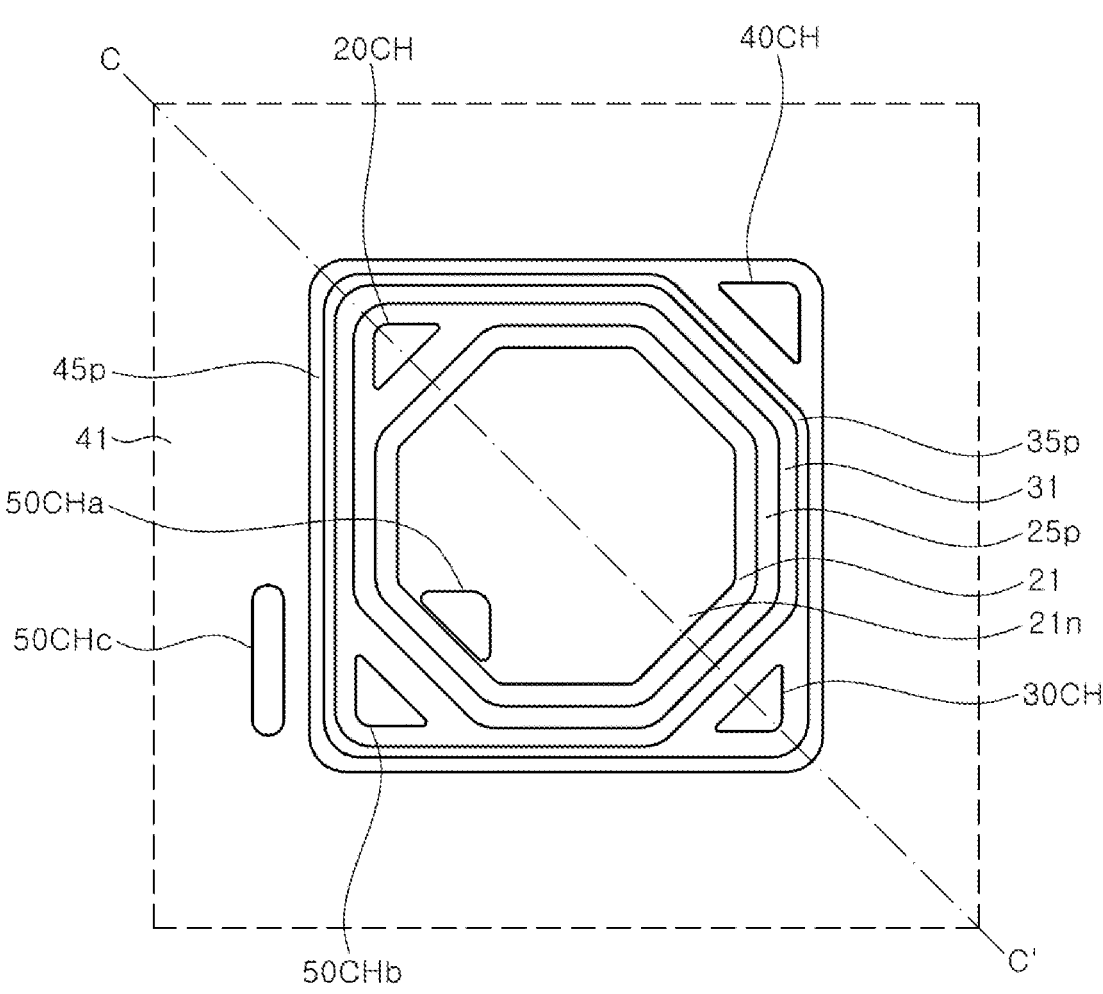
Figure 5B:
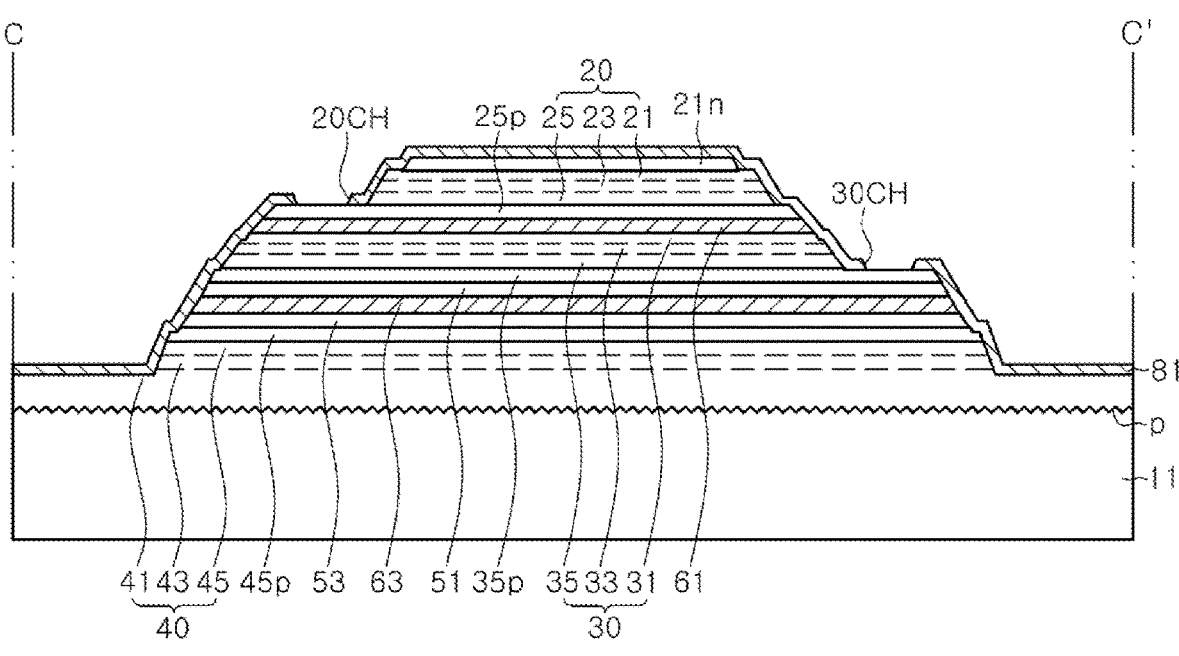

Referring to FIGS. 5A and 5B, the first insulation layer 81 may be formed so as to cover the upper surfaces and side surfaces of the LED stacks 20, 30, and 40, and at least a portion of the first insulation layer 81 may be removed so as to form the first, second, third, and fourth contact holes 20CH, 30CH, 40CH, and 50CH.

The first contact hole 20CH may be defined on the first lower contact electrode 25p to expose a portion of the first lower contact electrode 25p. The second contact hole 30CH may be defined on the second lower contact electrode 35p to expose a portion of the second lower contact electrode 35p. The third contact hole 40CH may expose a portion of the third lower contact electrode 45p. The fourth contact hole 50CH may include the first sub-contact hole 50CHa, the second sub-contact hole 50CHb, and the third sub-contact hole 50CHc exposing each of the first conductivity type semiconductor layers 21, 31, and 41 of the first, second, and third LED stacks 20, 30, and 40.

Figure 6A:
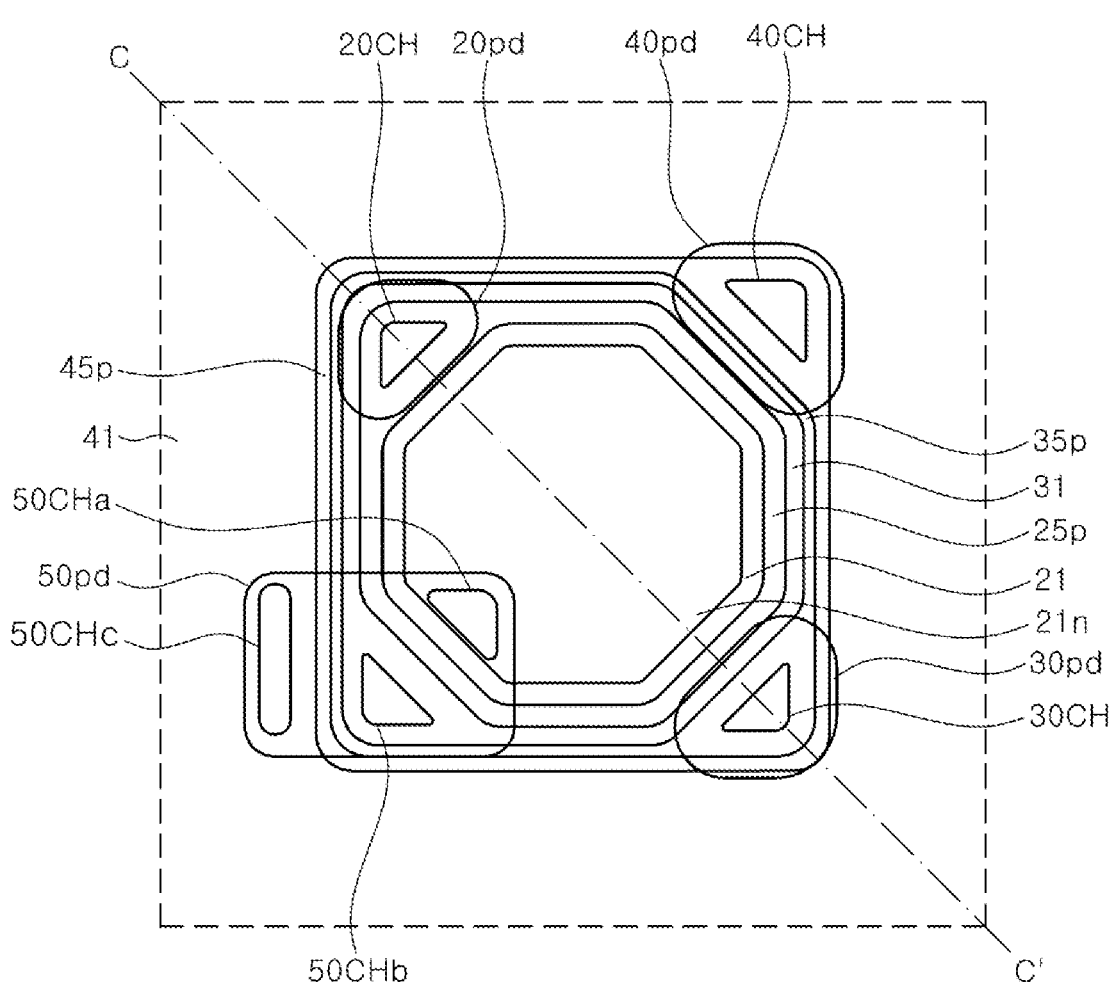
Figure 6B:
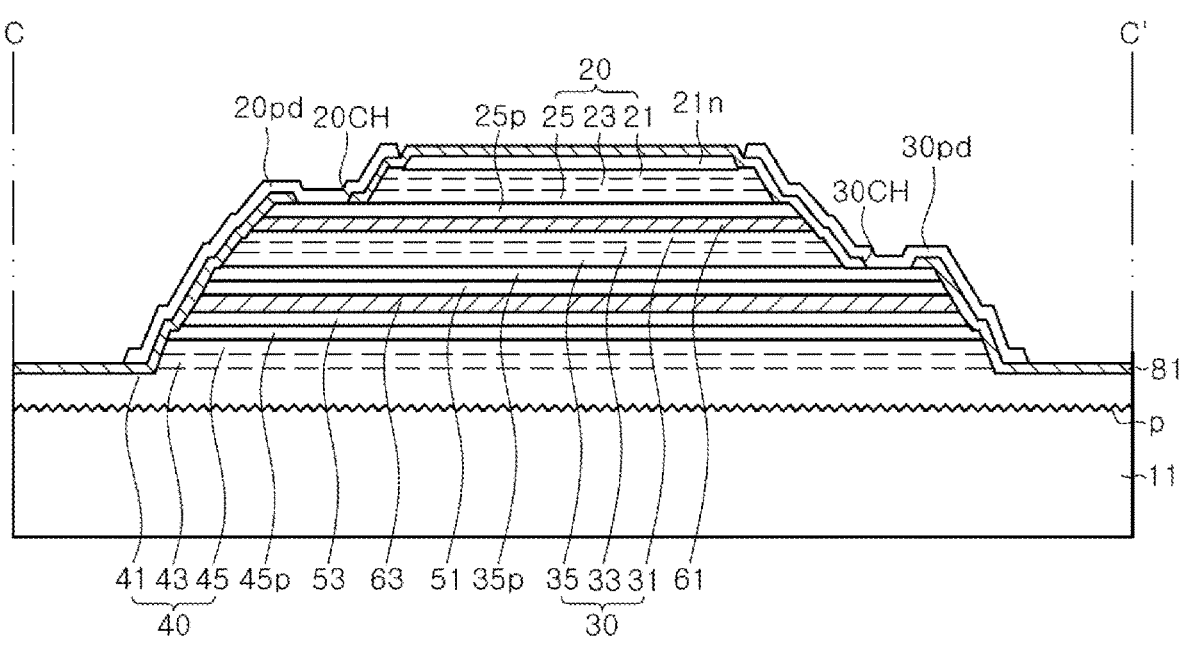

Referring to FIGS. 6A and 6B, the first, second, third, and fourth electrode pads 20pd, 30pd, 40pd, and 50pd may be formed on the first insulation layer 81 formed to have the first, second, third, and fourth contact holes 20CH, 30CH, 40CH, and 50CH. The first, second, third, and fourth electrode pads 20pd, 30pd, 40pd, and 50pd may be formed by, for example, forming conductive layers on an entire surface of the substrate 11, patterning the conductive layers through a photolithography process, and depositing and lifting off a metal material.

The first electrode pad 20pd may be formed so as to be overlapped with a region in which the first contact hole 20CH is formed, and the first electrode pad 20pd may be connected to the first lower contact electrode 25p through the first contact hole 20CH. The second electrode pad 30pd may be formed so as to be overlapped with a region in which the second contact hole 30CH is formed, and the second electrode pad 30pd may be connected to the second lower contact electrode 35p through the second contact hole 30CH. The third electrode pad 40pd may be formed so as to be overlapped with a region in which the third contact hole 40CH is formed, and the third electrode pad 40pd may be connected to the third lower contact electrode 45p through the third contact hole 40CH. The fourth electrode pad 50pd may be formed so as to be overlapped with a region in which the fourth contact hole 50CH is formed, in particular, a region in which the first, second, and third sub-contact holes 50CHa, 50CHb, and 50CHc are formed, and the fourth electrode pad 50pd may be connected to the first conductivity type semiconductors 21, 31, and 41 of each of the first, second, and third LED stacks 20, 30, and 40.

Figure 7A:
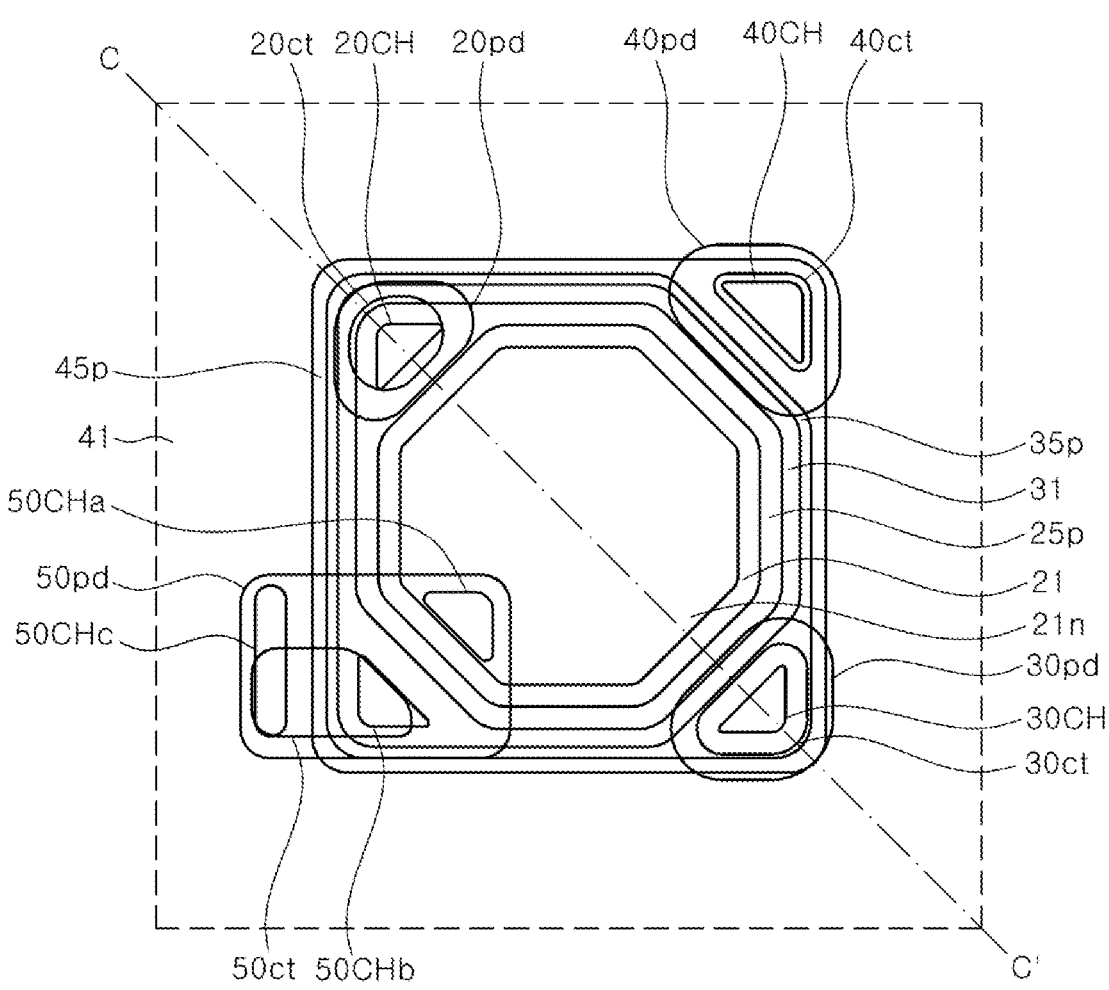
Figure 7B:
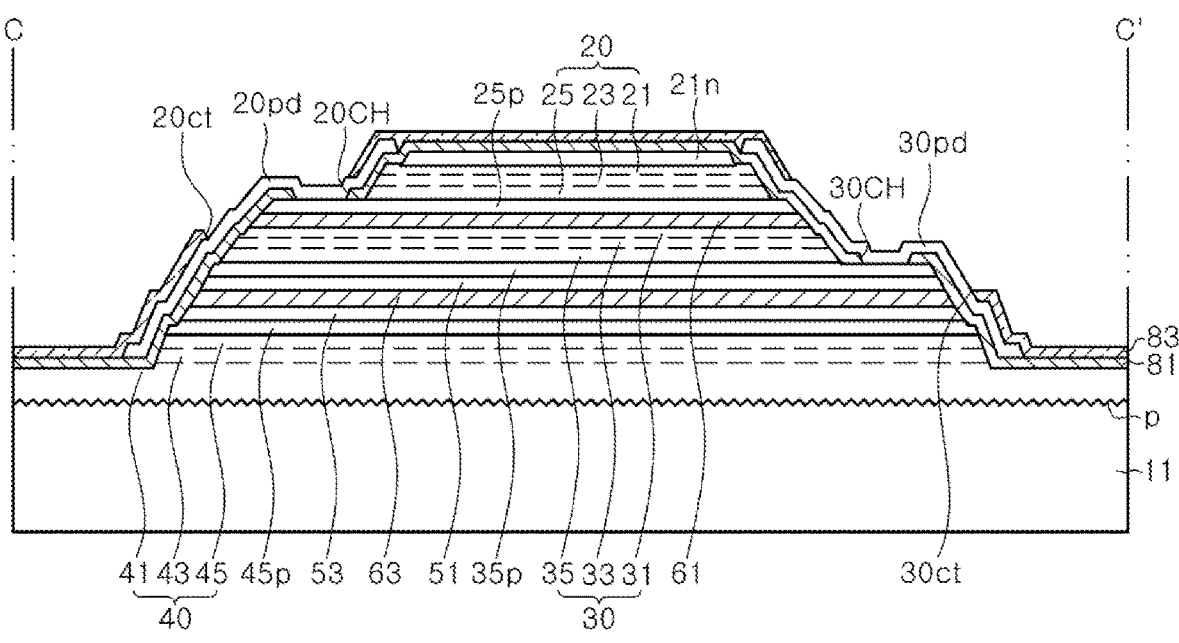

Referring to FIGS. 7A and 7B, the second insulation layer 83 may be formed on the first insulation layer 81. The first insulation layer 81 may include a silicon oxide-based material, and the second insulation layer 83 may include a distributed Bragg reflector (DBR), without being limited thereto. Subsequently, the second insulation layer 83 may be patterned to form the first, second, third, and fourth through holes 20ct, 30ct, 40ct, and 50ct.

The first through hole 20ct formed on the first electrode pad 20pd may expose at least a portion of the first electrode pad 20pd. The second through hole 30ct formed on the second electrode pad 30pd may expose at least a portion of the second electrode pad 30pd. The third through hole 40ct formed on the third electrode pad 40pd may expose at least a portion of the third electrode pad 40pd. The fourth through hole 50ct formed on the fourth electrode pad 50pd may expose at least a portion of the fourth electrode pad 50pd. The first, second, third, and fourth through holes 20ct, 30ct, 40ct, and 50ct may be defined within a region in which the first, second, third, and fourth electrode pads 20pd, 30pd, 40pd, and 50pd are formed, respectively.

Figure 8A:
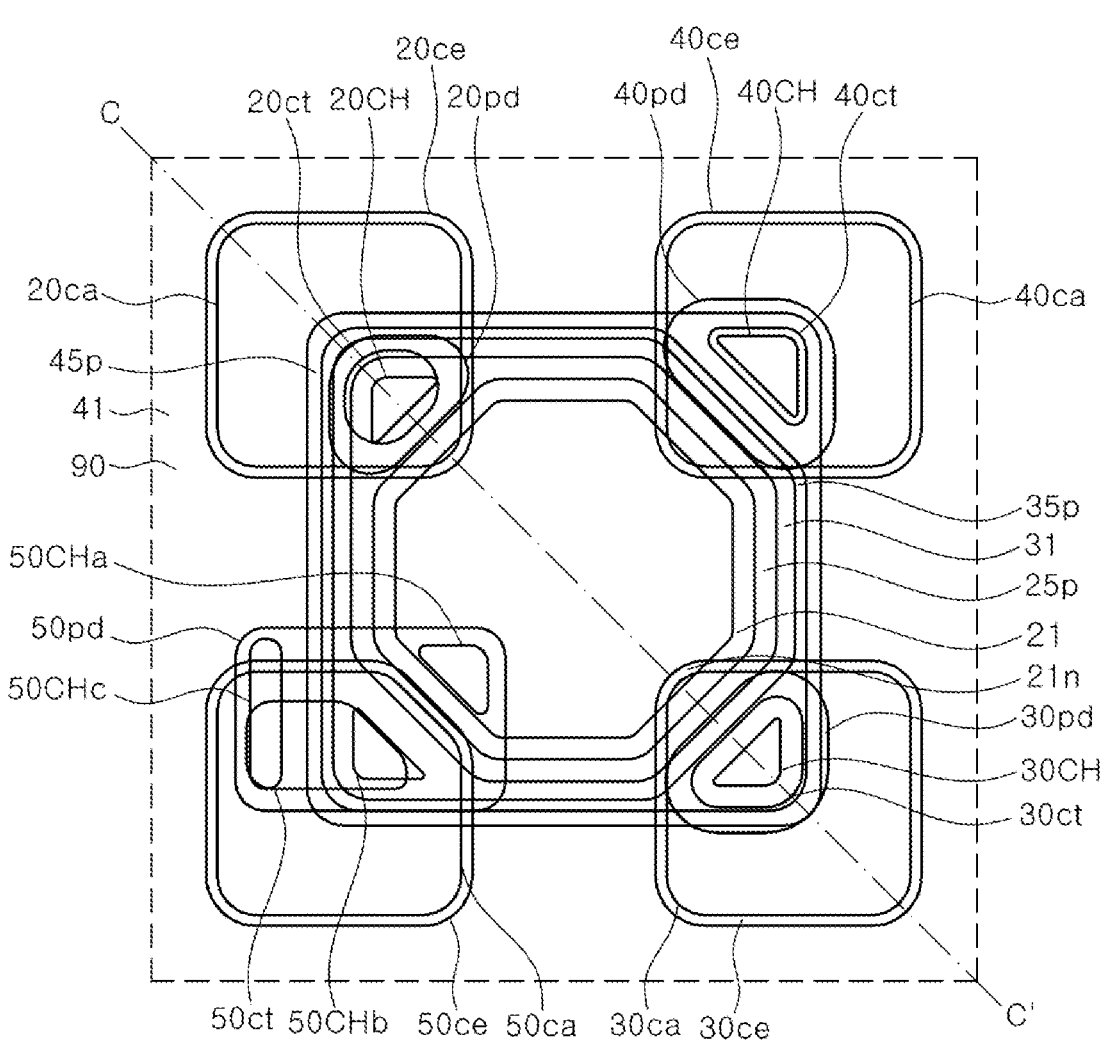
Figure 8B:
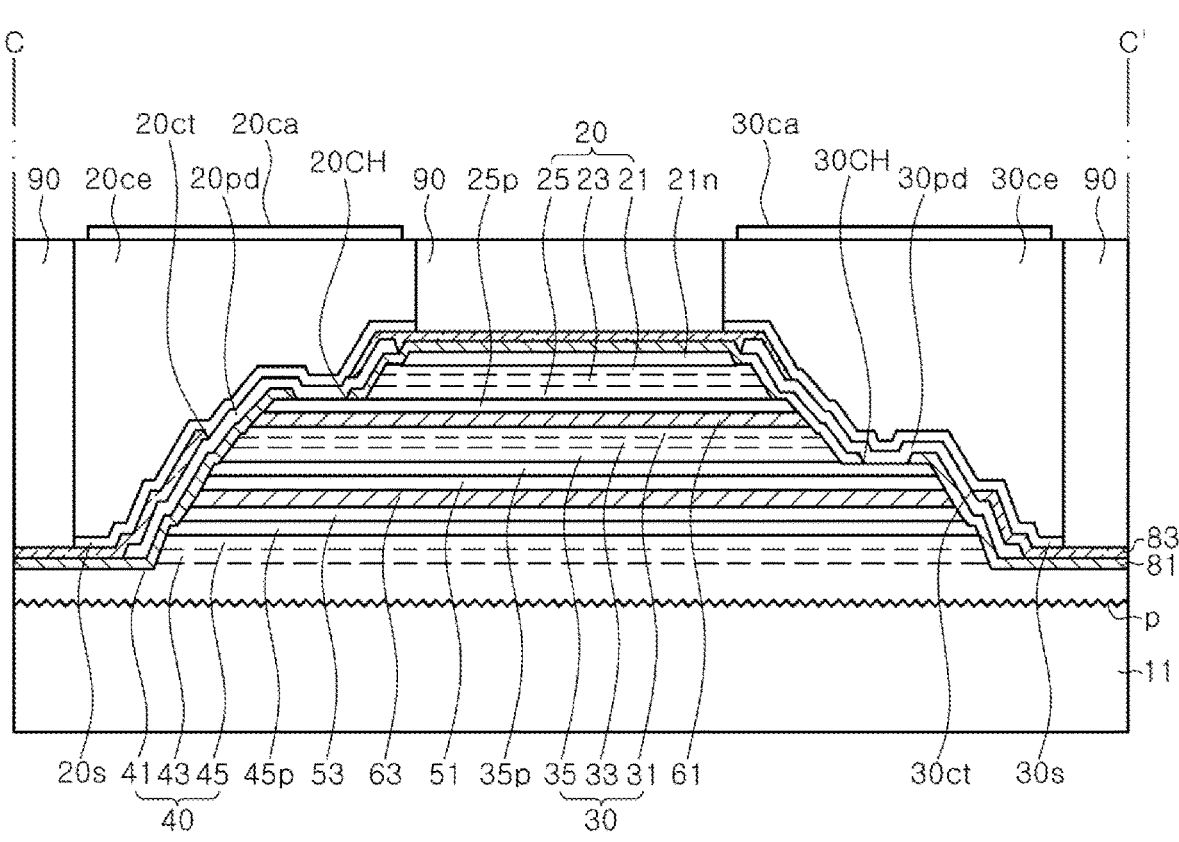

Referring to FIGS. 8A and 8B, the first through fourth connection electrodes 20ce, 30ce, 40ce, and 50ce may be connected to the electrode pads 20pd, 30pd, 40pd, and 60pd, respectively. After the first, second, third, and fourth through holes 20ct, 30ct, 40ct, and 50ct are formed so as to partially expose the electrode pads 20pd, 30pd, 40pd, and 50pd, the seed layers 20s, 30s, 40s, and 50s may be deposited on the first, second, and third sub-units 2, 3, and 4 as conductive surfaces, and the seed layers 20s, 30s, 40s, and 50s may be patterned using photolithography or the like, such that the seed layers 20s, 30s, 40s, and 50s are disposed at positions where the connection electrodes are to be formed.

The seed layers 20s, 30s, 40s, and 50s may be deposited to have a thickness of, about 1,000 Å, without being limited thereto. The seed layers 20s, 30s, 40s, and 50s may be formed of, for example, Ti/Cu. Subsequently, the first, second, third, and fourth connection electrodes 20ce, 30ce, 40ce, and 50ce may be plated with metal, such as Cu, Ni, Ti, Sb, Zn, Mo, Co, Sn, Ag or an alloy thereof on the seed layers 20s, 30s, 40s, and 50s.

In addition, to prevent oxidation of the plated metal, the protection metal layers 20ca, 30ca, 40ca, and 50ca may be further disposed on the first, second, third, and fourth connection electrodes 20ce, 30ce, 40ce, and 50ce, and the protection metal layers 20ca, 30ca, 40ca, and 50ca may be deposited or plated on the plated metal by electroless nickel immersion gold (ENIG) or the like.

The first through fourth connection electrodes 20ce, 30ce, 40ce, and 50ce may have an elongated shape in the vertical direction of the substrate 11. In addition, the first through fourth connection electrodes 20ce, 30ce, 40ce, and 50ce may include two or more metals or a plurality of different metal layers so as to reduce stress due to the elongated shape. However, the inventive concepts are not limited to specific shapes of the first through fourth connection electrodes 20ce, 30ce, 40ce, and 50ce.

Each of the first through fourth connection electrodes 20ce, 30ce, 40ce, and 50ce may have the flat upper surface so as to facilitate electrical connection between the first, second, and third sub-units 2, 3, and 4 and an external line or electrode. Accordingly, lower surfaces of the first through fourth connection electrodes 20ce, 30ce, 40ce, and 50ce may have larger surface areas than those of the upper surfaces, which provides a larger contact area between the first through fourth connection electrodes 20ce, 30ce, 40ce, and 50ce and the first, second, and third sub-units 2, 3, and 4, so that it may provide a more stable structure for the first, second, and third sub-units 2, 3, and 4 together with the protection layer 90 to withstand subsequent processes.

The protection layer 90 may be disposed between the first through fourth connection electrodes 20ce, 30ce, 40ce, and 50ce. The protection layer 90 may be formed substantially in flush with the upper surfaces of the first through fourth connection electrodes 20ce, 30ce, 40ce, and 50ce by a polishing process or the like. In an exemplary embodiment, the protection layer 90 may include a black epoxy molding compound (EMC), without being limited thereto. For example, the protection layer 90 may include a photosensitive polyimide dry film (PID). Accordingly, the protection layer 90 may not only protect the first, second, and third sub-units 2, 3, and 4 from external impacts that may be applied during a subsequent process, but also provide a sufficient contact area to the first, second, and third sub-units 2, 3, and 4 to facilitate its handling during a subsequent transferring step. In addition, the protection layer 90 may be transparent, or may have various colors such as black, white, or others, and may prevent or suppress interference of light emitted from an adjacent light emitting device 100 by preventing light leakage to the side surface of the light emitting device 100.

In the light emitting device of the above-described exemplary embodiment, red light generated in the first sub-unit 2 is emitted through the second sub-unit 3 and the third sub-unit 4. In this case, light loss due to absorption may occur while red light passes through the second sub-unit 3 and the third sub-unit 4. Furthermore, light generated in the first sub-unit 2 may be absorbed and lost by the first upper contact electrode 21n, and thus, a radiation efficiency of red light is low. Hereinafter, a light emitting device for improving the radiation efficiency of red light will be described in detail.

Figure 9A:
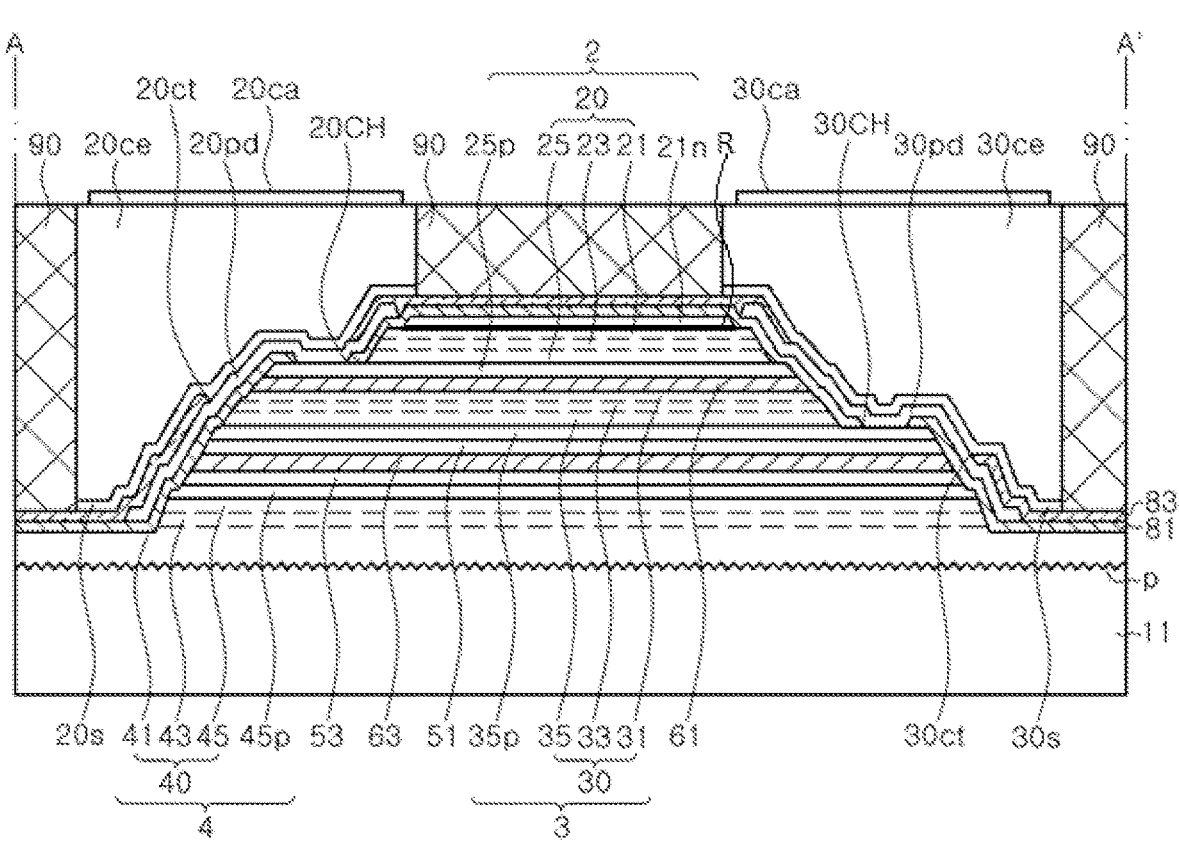
FIG. 9A is a cross-sectional view of a light emitting device according to an exemplary embodiment.
Figure 9B:
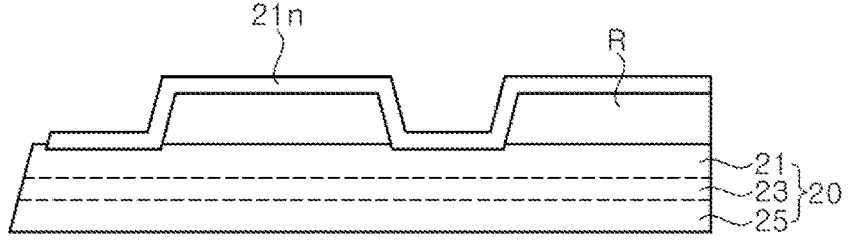
FIG. 9B is a schematic partial enlarged cross-sectional view illustrating an extraction element of FIG. 9A.
Figure 9C:
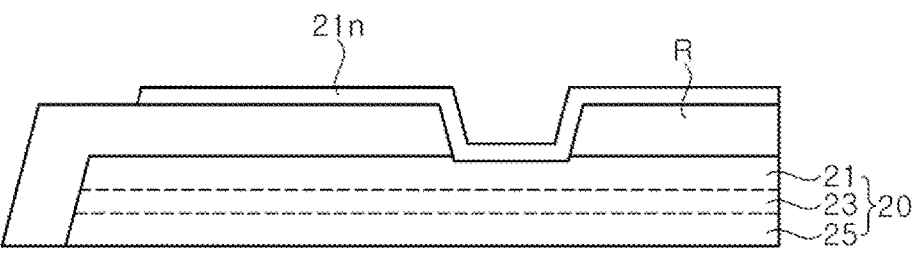
FIG. 9C is a schematic partial enlarged cross-sectional view illustrating another example of the extraction element of FIG. 9A.

FIG. 9A is a schematic cross-sectional view illustrating a light emitting device according to an embodiment of the present disclosure, FIG. 9B is a schematic partial enlarged cross-sectional view illustrating an extraction element of FIG. 9A, FIG. 9C is a schematic partial enlarged cross-sectional view illustrating another example of the extraction element of FIG. 9A.

Referring to FIG. 9A, the light emitting device according to this exemplary embodiment is substantially similar to the light emitting device 100 described with reference to FIGS. 2A through 2D, except that it further includes an extraction element R. Since other elements except for the extraction element R are substantially the same as those of the light emitting device 100 described with reference to FIGS. 2A through 2D, detailed descriptions thereof are omitted to avoid redundancy.

An extraction element R may be disposed between the first upper contact electrode 21n and the first conductivity type semiconductor layer 21 to increase an extraction efficiency of light emitted from the first sub-unit 2. The extraction element R may be formed by depositing a transparent electrode or a plurality of materials having different refractive indices, such as $SiO_2$, $TiO_2$, $SiN_x$, ITO, ZnO, or the like may be used, and two or more materials may be alternately stacked. When alternately stacked, $TiO_2$ may include 15 or more layers, and $SiO_2$ may include 15 or more layers. A total thickness of the extraction element R may be 1 μm or more. The extraction element R may include a distributed Bragg reflector. For ohmic formation of the first upper contact electrode 21n and the first conductivity type semiconductor layer 21, the extraction element R may be patterned to expose a portion of the first conductivity type semiconductor layer 21. The first upper contact electrode 21n may be electrically connected to the first conductivity type semiconductor layer 21 exposed around or through the extraction element R. The first conductivity type semiconductor layer 21 may be exposed in one region, or may be exposed in a plurality of regions spaced apart from one another for current spreading.

As shown in FIG. 9B, the first upper contact electrode 21n may form a step along a side surface of the extraction element R. In the above case, to form a stable electrode, a thickness of the extraction element R may be about 5 μm or less. When the thickness of the extraction element R becomes too large, a height of the step increases, and thus, cracks may occur in the first upper contact electrode 21n. Therefore, the thickness of the extraction element R may be in a range of 1 μm to 5 μm.

As shown in FIG. 9B, an outermost side surface of the extraction element R may be covered with the first upper contact electrode 21n. The first upper contact electrode 21n may be formed up to an outer region of the first conductivity type semiconductor layer 21, and thus, it is possible to supply current over a large area of the first conductivity type semiconductor layer 21.

In another form, as shown in FIG. 9C, the extraction element R may extend to a side surface of a mesa of the first conductivity type semiconductor layer 21. Furthermore, the extraction element R may cover a side surface of the active layer 23, and may extend to a side surface of the second conductivity type semiconductor layer 25. Light emitted from the active layer 23 is not emitted in one direction but is emitted in all directions, and in this case, light is also emitted from the side surface of the active layer 23. Since light emitted from the side surface is reflected by the extraction element R and emitted to the outside, a light extraction efficiency of red light may be improved.

In this exemplary embodiment, the extraction element R may be formed before the first upper contact electrode 21n is formed. In an exemplary embodiment, the extraction element R may be formed by etching and removing a partial region of the first conductivity type semiconductor layer 21 using a lift-off technique. Since the lift-off technology is used, the extraction element R may be formed without using an etching stop layer, and thus the manufacturing process thereof may be simplified. In another exemplary embodiment, the extraction element R may be formed first before removing the partial region of the first conductivity type semiconductor layer 21, and the partial region of the first conductivity type semiconductor layer 21 may be removed while the extraction element R is formed, or may be formed through an additional process after the extraction element R is formed. As shown in FIGS. 9B and 9C, a contact portion where the first upper contact electrode 21n contacts the first conductivity type semiconductor layer 21 may be positioned below a contact portion where the extraction element R contacts the first conductivity type semiconductor layer 21.

Figure 10A:
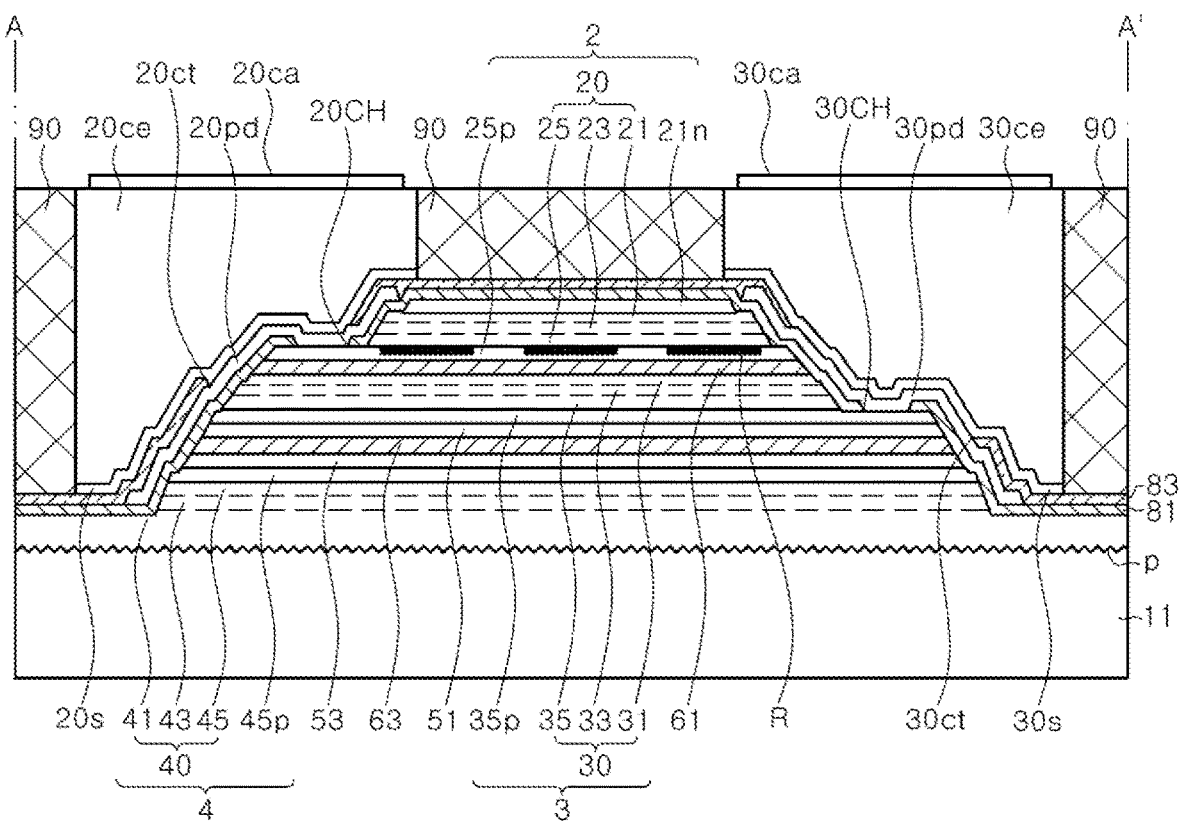
FIG. 10A is a cross-sectional view of a light emitting device according to an exemplary embodiment.
Figure 10B:
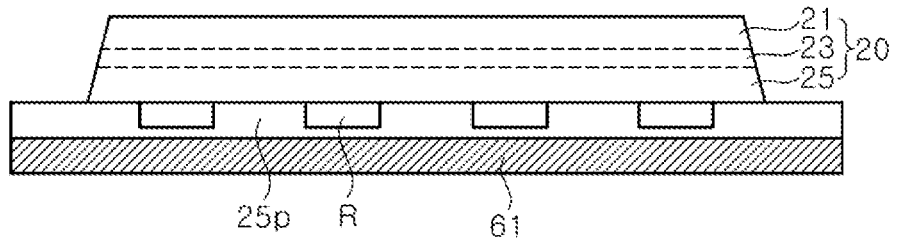
FIG. 10B is a schematic partial enlarged cross-sectional view illustrating an extraction element of FIG. 10A.
Figure 10C:
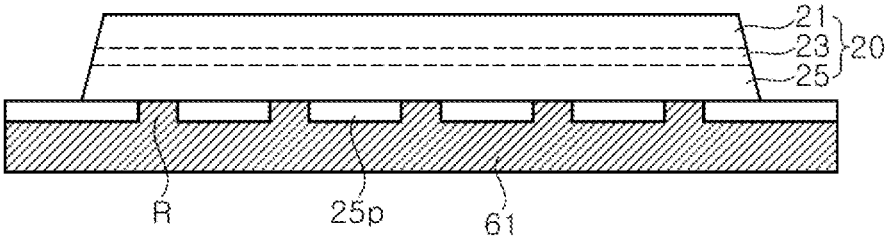
FIG. 10C is a schematic partial enlarged cross-sectional view illustrating another example of the extraction element of FIG. 10A.
Figure 10D:
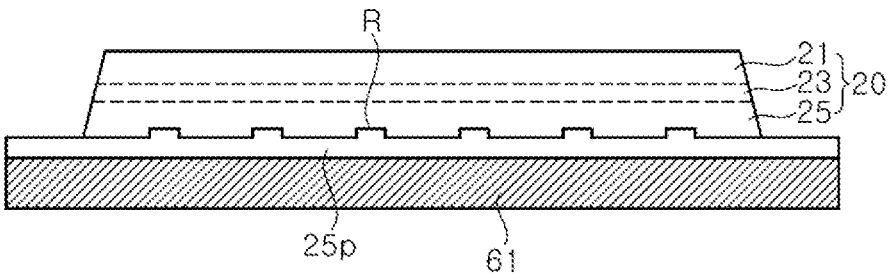
FIG. 10D is a schematic partial enlarged cross-sectional view illustrating another example of the extraction element of FIG. 10A.

FIG. 10A is a schematic cross-sectional view illustrating a light emitting device according to another exemplary embodiment, FIG. 10B is a schematic partial enlarged cross-sectional view illustrating the extraction element of FIG. 10A, FIG. 10C is a schematic partial enlarged cross-sectional view illustrating another example of the extraction element of FIG. 10A, and FIG. 10D is a schematic partial enlarged cross-sectional view illustrating another example of the extraction element of FIG. 10A.

Referring to FIG. 10A, the light emitting device according to this exemplary embodiment is substantially similar to the light emitting device 100 described with reference to FIGS. 2A through 2D, except that it further includes an extraction element R. Since other elements except for the extraction element R are substantially the same as those of the light emitting device 100 described with reference to FIGS. 2A through 2D, detailed descriptions thereof are omitted to avoid redundancy.

The extraction element R may be formed between the second conductivity type semiconductor layer 25 and the first lower contact electrode 25p. For an ohmic formation of the first lower contact electrode 25p and the second conductivity type semiconductor layer 25, the extraction element R may expose a portion of the second conductivity type semiconductor layer 25. The first lower contact electrode 25p may be electrically connected to the second conductivity type semiconductor layer 25 exposed through the extraction element R. The second conductivity type semiconductor layer 25 may be exposed in one region, or may be exposed in a plurality of regions spaced apart from one another for current spreading.

The first lower contact electrode 25p may form a step along a side surface of the extraction element R. Although not shown in the drawings, an outermost side surface of the extraction element R may be covered with the first lower contact electrode 25p. The first lower contact electrode 25p may also be connected to an outer region of the second conductivity type semiconductor layer 25, so that it is possible to supply current over a large area of the second conductivity type semiconductor layer 25.

The extraction element R may be formed of various materials and in various shapes. In an exemplary embodiment, as shown in FIG. 10B, the extraction element R may be formed on the second conductivity type semiconductor layer 25. The extraction element R may be formed of islands spaced apart from one another, or may be formed to have a plurality of holes like a mesh shape. The first lower contact electrode 25p may cover the extraction element R and be connected to the second conductivity type semiconductor layer 25 exposed through the extraction element R. In this exemplary embodiment, the extraction element R may be formed of a material having a different refraction index from that of the first lower contact electrode 25p. For example, the first lower contact electrode 25p may be formed of indium tin oxide (ITO), and the extraction element R may be formed of an insulation layer, such as silicon oxide or silicon nitride. By disposing the extraction element R having the refraction index different from that of the first lower contact electrode 25p, an extraction efficiency of red light may be improved using light scattering.

In another exemplary embodiment, as shown in FIG. 10C, the extraction element R may be formed by patterning the first lower contact electrode 25p. The first lower contact electrode 25p may have a plurality of holes exposing the second conductivity type semiconductor layer 25, and the first adhesive layer 61 may fill holes of the first lower contact electrode 25p. The first adhesive layer 61 has a refraction index different from that of the first lower contact electrode 25p, and thus, an extraction efficiency of red light may be improved through light scattering.

In another exemplary embodiment, as shown in FIG. 10D, the extraction element R may be formed by patterning a surface of the second conductivity type semiconductor layer 25. For example, a plurality of grooves is formed on the surface of the second conductivity type semiconductor layer 25, and the first lower contact electrode 25p may fill the plurality of grooves. Accordingly, regions having different refraction indices are formed on the surface of the second conductivity type semiconductor layer 25 to improve the extraction efficiency of red light.

Figure 11A:
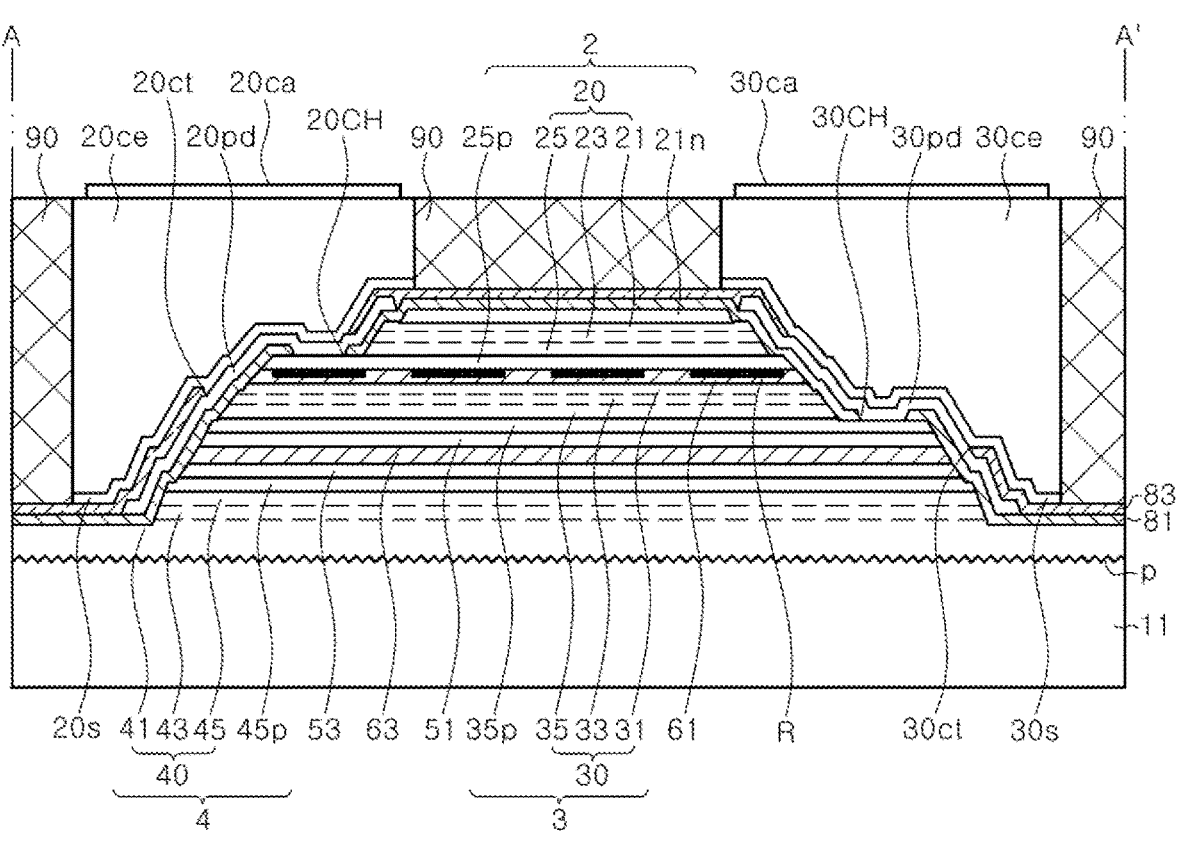
FIG. 11A is a cross-sectional view of a light emitting device according to an exemplary embodiment.
Figure 11B:
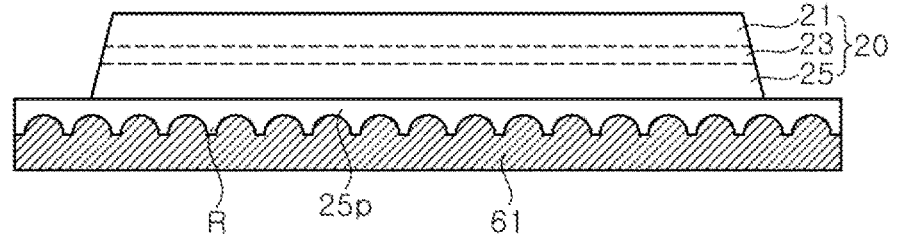
FIG. 11B is a schematic partial enlarged cross-sectional view illustrating another example of an extraction element of FIG. 11A.

FIG. 11A is a cross-sectional view of a light emitting device according to an exemplary embodiment, and FIG. 11B is a schematic partial enlarged cross-sectional view illustrating another example of an extraction element of FIG. 11A.

Referring to FIG. 11A, the extraction element R may be formed between a first adhesive layer 61 and a first lower contact electrode 25p. For example, the extraction element R may be formed on an entire surface of a first lower contact electrode 25p to contact one surface of the first adhesive layer 61. Since light may be uniformly dispersed and reflected by the extraction element R formed on the entire surface of the first lower contact electrode 25p, a light extraction efficiency may be improved. Alternatively, as shown in FIG. 11A, the extraction element R may be patterned such that a partial region of the first lower contact electrode 25p is exposed. A first adhesive layer 61 may contact the exposed first lower contact electrode 25p.

The first adhesive layer 61, the first lower contact electrode 25p, and the extraction element R have different refraction indices from one another, and since the extraction element R is patterned, a plurality of regions having different refraction indices is arranged in a transverse direction. Accordingly, a region where the first lower contact electrode 25p, the extraction element R, and the first adhesive layer 61 overlap, and a region where the first lower contact electrode 25p overlaps the first adhesive layer 61 without overlapping the extraction element R are repeatedly arranged in the transverse direction. That is, a change in the refraction index on a light path varies in the transverse direction, and light reflection and extraction efficiency may increase due to the plurality of regions having different changes in the refraction index. In this exemplary embodiment, the extraction element R may be formed of a material having a refraction index different from that of the first lower contact electrode 25p, but the inventive concepts are not limited thereto. In some exemplary embodiments, the extraction element R may be formed of a same material as that of the first lower contact electrode 25p, for example, ITO.

In an exemplary embodiment, as shown in FIG. 11B, the extraction element R may be formed on a lower surface of the first lower contact electrode 25p. The first lower contact electrode 25p may include a concavo-convex pattern on its lower surface, and the concavo-convex pattern may be the extraction element R. The concave-convex pattern of the first lower contact electrode 25p may be covered with the first adhesive layer 61. Hereinafter, one method of forming the extraction element R of FIG. 11B will be described in detail with reference to FIGS. 12A through 12E.

The extraction element R may be formed in a form of a plurality of islands, or may be formed in a concavo-convex pattern. The extraction element R may be formed through a process of depositing a material of the extraction element R on beads B and removing the beads B.

Figure 12A:
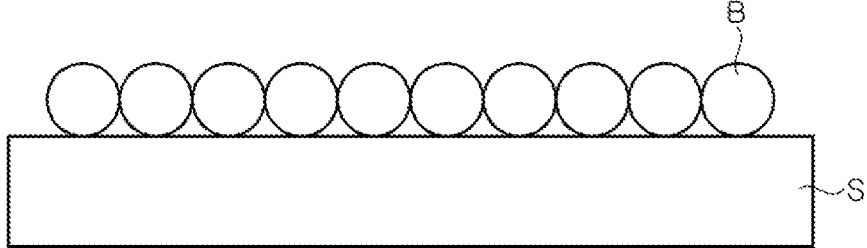
FIGS. 12A, 12B, 12C, 12D, and 12E are cross-sectional views illustrating a method of manufacturing a light emitting device according to an exemplary embodiment.

First, referring to FIG. 12A, the beads B may be disposed on an underlying layer S. The underlying layer S may be a second conductivity type semiconductor layer 25, or may be the first lower contact electrode 25p. The beads B may be arranged to be in close contact with one another, and thus, there is almost no gap between the beads B. The beads B may have a nano-sized size.

Figure 12B:
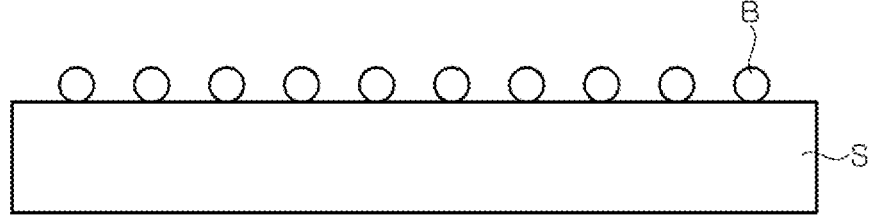

Referring to FIG. 12B, gaps are formed between the beads B such that the extraction element R can contact a surface of the underlying layer S. To this end, an etching process of the beads B may be performed. Plasma etching using reactive ion etch (RIE) may be used. By etching the beads B, sizes of the beads B are reduced, and thus, the gaps are generated between the beads B, so that the surface of the underlying layer S may be exposed between the beads B.

Figure 12C:
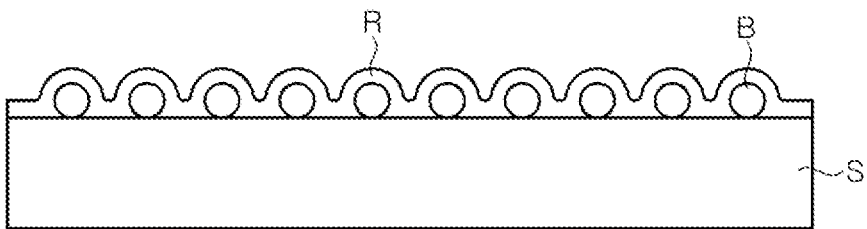

Referring to FIG. 12C, the extraction element R is deposited to cover the beads B. The extraction element R is deposited along an upper surface of the bead B and the surface of the underlying layer S, and the extraction element R is also formed to have a concavo-convex structure due to a protruding shape of the bead B.

Figure 12D:
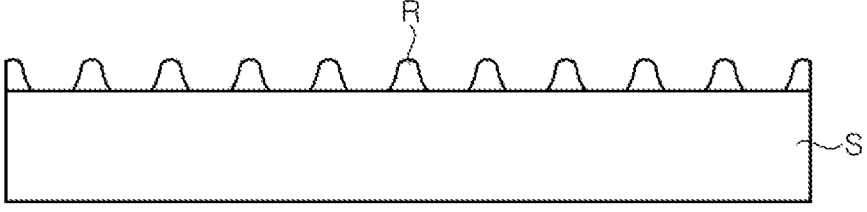

Referring to FIG. 12D, the beads B are removed. As the beads B are removed, extraction elements R formed on the surface of the underlying layer S between the beads B may be retained. In this case, the beads B and extraction elements R in contact with the upper surface and portions of side surfaces of the beads B may be removed. In this manner, the extraction element R may be formed as a plurality of islands or in a mesh shape on the underlying layer S. The plurality of islands may be a surface having a curved shape. In addition, each island may have a shape in which a thickness thereof changes in a lateral direction. When the underlying layer S is a conductive oxide, such as ITO, a material of the extraction element R is not particularly limited, and may be formed of, for example, a conductive oxide, such as ITO. The extraction element R formed as described above may be disposed on upper surfaces or lower surfaces of the first, second, and third LED stacks 20, 30, and 40, and/or anywhere between the LED stacks 20, 30, and 40.

Although the manufacturing method of the extraction element R has been exemplarily described above with reference to FIGS. 12A to 12D, an additional process may be performed on the extraction element R of FIG. 12D to form an extraction element having a concavo-convex pattern on the surface.

Figure 12E:
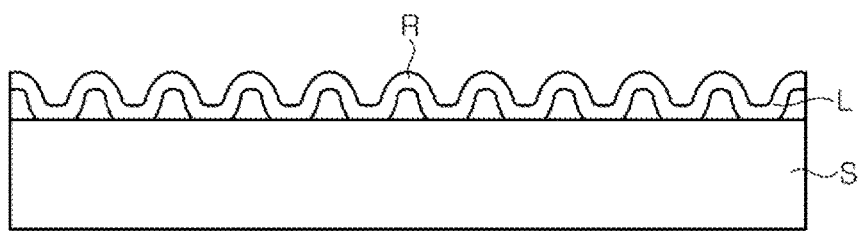

For example, as shown in FIG. 12E, an additional layer L may be formed on the extraction element R described with reference to FIG. 12D. For example, when the underlying layer S is the second conductivity type semiconductor layer 25, the additional layer L may be formed of a material for forming the first lower contact electrode 25p. The additional layer L covers the surface of the underlying layer S exposed by the extraction element R in FIG. 12D, and covers the extraction element R in FIG. 12D. As a result, the underlying layer S may be covered with the additional layer L having a concavo-convex pattern formed on a surface thereof, and finally, the concavo-convex pattern may function as the extraction element R. The additional layer L may be formed of, for example, ITO. Furthermore, the extraction element R in FIG. 12D is not limited to a specific material, and may be, for example, ITO.

FIGS. 13, 14A, 14B, and 15 are cross-sectional views and plan views schematically illustrating a manufacturing process of a light emitting module according to an exemplary embodiment. Hereinafter, the light emitting device 100 will exemplarily be described with reference to that shown in FIG. 2A, however, the inventive concepts are not limited thereto, and the light emitting device 100 may be any of the ones shown in FIGS. 9A, 10A, or 11A.

Figure 13:
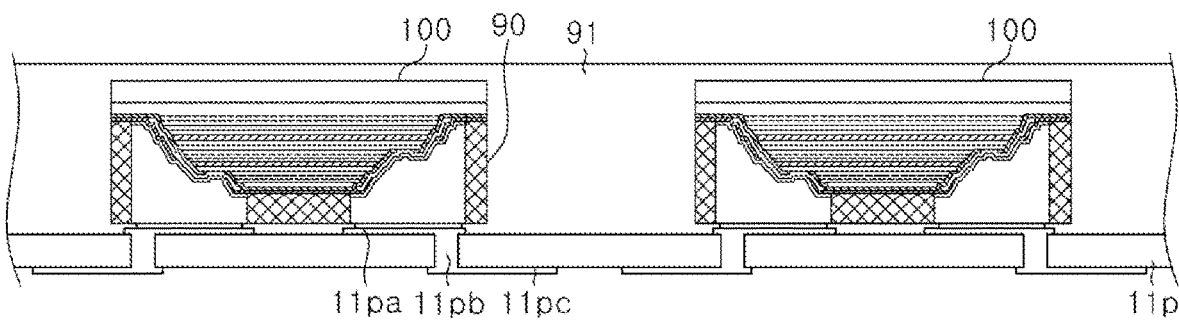
FIGS. 13, 14A, 14B, and 15 are cross-sectional views schematically illustrating a manufacturing process of a light emitting module according to an exemplary embodiment.

Referring to FIG. 13, the light emitting devices 100 may be mounted on a circuit board 11p. The circuit board 11p may include an electrically connected upper circuit electrode 11pa, a lower circuit electrode 11pc, and an intermediate circuit electrode 11pb. The upper circuit electrode 11pa may be mounted to correspond to each of the first, second, third, and fourth connection electrodes 20ce, 30ce, 40ce, and 50ce. The circuit board 11p may include any material on which the light emitting devices 100 can be mounted, such as a conductive circuit board, a printed circuit board, polyimide, or the like.

The first, second, third, and fourth connection electrodes 20ce, 30ce, 40ce, and 50ce of the light emitting device 100 may be bonded to the upper circuit electrode 11pa of the circuit board 11p with a bonding agent. The bonding agent may be solder, and after disposing a solder paste on the upper circuit electrodes 11pa of the circuit board 11p using a screen printing technique, the light emitting device 100 and the circuit board 11p may be bonded through a reflow process. However, the inventive concepts are not limited thereto, and they may be connected by eutectic bonding, epoxy bonding, anisotropic conductive film (ACF) bonding, ball grid array (BGA), or the like.

A molding layer 91 may be formed between the light emitting devices 100. The molding layer 91 may transmit at least a portion of light emitted from the light emitting device 100, and may reflect, diffract, and absorb a portion of external light so as to prevent the external light from being reflected by the light emitting device 100 in a direction visible to a user. The molding layer 91 may cover at least a portion of the light emitting device 100 to protect the light emitting device 100 from moisture and external impact. In addition, the molding layer 91 may protect the light emitting module together with the protection layer 90 formed on the light emitting device 100.

The molding layer 91 may further include a filler, such as silica, $TiO_2$, alumina, or the like. In some exemplary embodiments, the molding layer 91 may include a same material as that of the protection layer 90.

The molding layer 91 may be formed through a method such as lamination or ink jet printing. For example, the molding layer 91 may formed by a vacuum lamination process, in which an organic polymer sheet is disposed on the light emitting device 100 and high temperature and high pressure are applied in a vacuum, and provides a flat upper surface of the light emitting module, thereby improving light uniformity.

The molding layer 91 may be formed to cover both the upper surface and the side surface of the light emitting device 100. The molding layer 91 may be formed of a transparent molding layer, or a black matrix molding layer including a light absorbing material so as to prevent light diffusion.

In another exemplary embodiment, the molding layer 91 may be formed between the light emitting devices 100 so as to expose the upper surface of the light emitting device 100 without covering the upper surface of the light emitting device 100, and may include a light absorbing material (e.g., a black matrix) so as to effectively block light. An upper surface of the molding layer 91 may have a shape in which a thickness thereof becomes smaller as being further apart from the side surface of the light emitting device 100, that is, a downward concave shape. Accordingly, it is possible to prevent a dark portion from becoming clear due to the black matrix in a region between the light emitting devices 100.

Although not shown in the drawings, an additional molding layer may be formed so as to cover the upper surfaces of the molding layer 91 and the light emitting device 100, and the additional molding layer may be a light-transmitting molding layer.

Figure 14A:
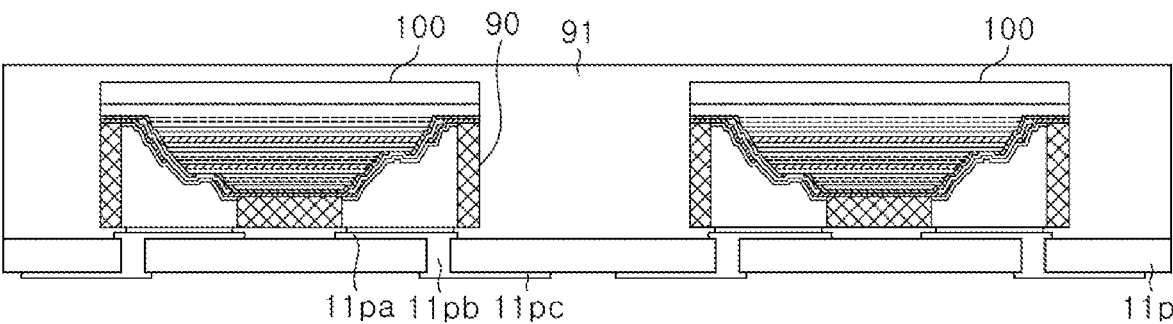
Figure 14B:
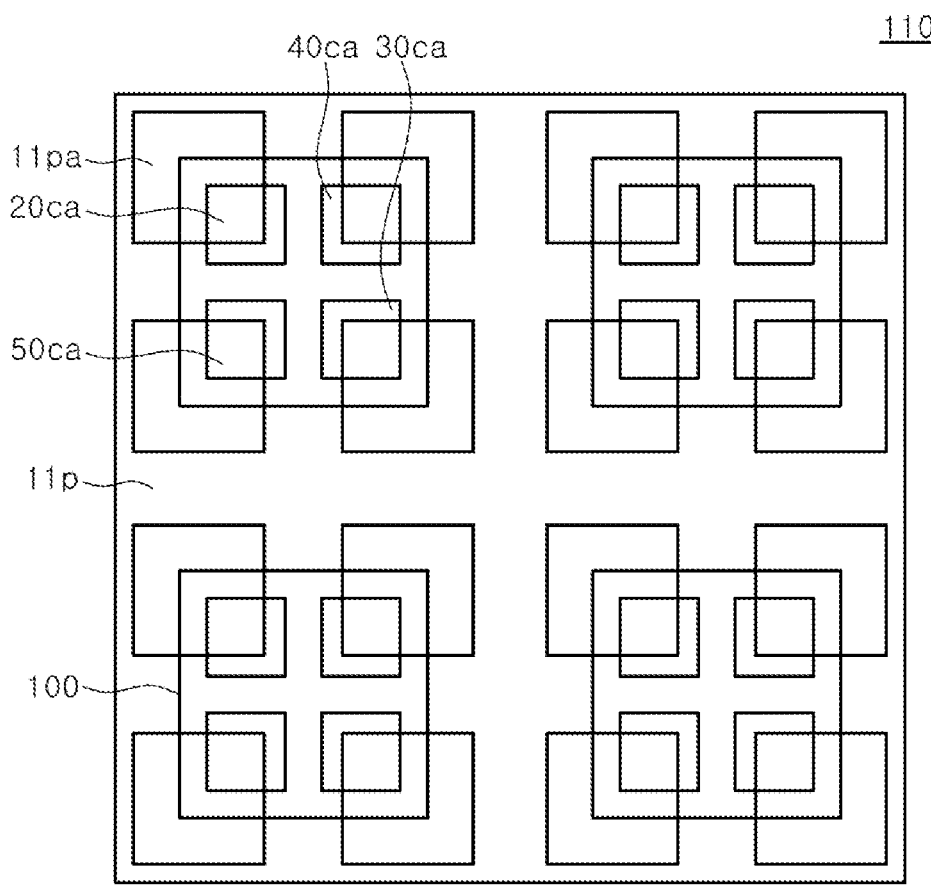

Referring to FIGS. 14A and 14B, the light emitting devices 100 disposed on the circuit board 11p may be cut into a configuration suitable for use, and formed into a light emitting module 110. FIG. 14B shows the light emitting module 110 including four light emitting devices 100 disposed on the circuit board 11p. However, the inventive concepts are not limited to the light emitting module 110 including a specific number of light emitting devices 100, and may include one or more light emitting devices 100. In addition, the light emitting device 100 may be arranged in a 2×2 on the circuit board 11p, without being limited thereto, and may be arranged in various matrices (n×m, n=1, 2, 3, 4, . . . , m=1, 2, 3, 4, . . . ). The circuit board 11p may include a scan line and a data line for independently driving each of the light emitting devices 100 included in the light emitting module 110.

Figure 15:
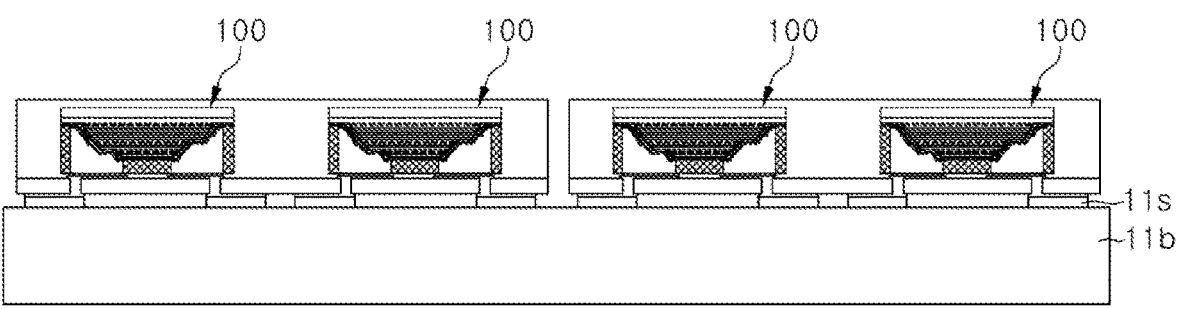

Referring to FIG. 15, the light emitting module 110 may be mounted on a target substrate 11b of a final device, such as a display apparatus. The target substrate 11b may include target electrodes 11s respectively corresponding to the lower circuit electrodes 11pc of the light emitting module 110. A display apparatus according to an exemplary embodiment may include a plurality of pixels, and each of the light emitting devices 100 may be disposed corresponding to each of the pixels. In more detail, each of the LED stacks of the light emitting device 100 may correspond to each of the sub-pixels of one pixel. Since the light emitting device 100 includes the first, second, and third LED stacks 20, 30, and 40 stacked vertically, the number of devices to be transferred for each of the sub-pixels may be substantially reduced compared to the number of conventional light emitting devices.

Figure 16:
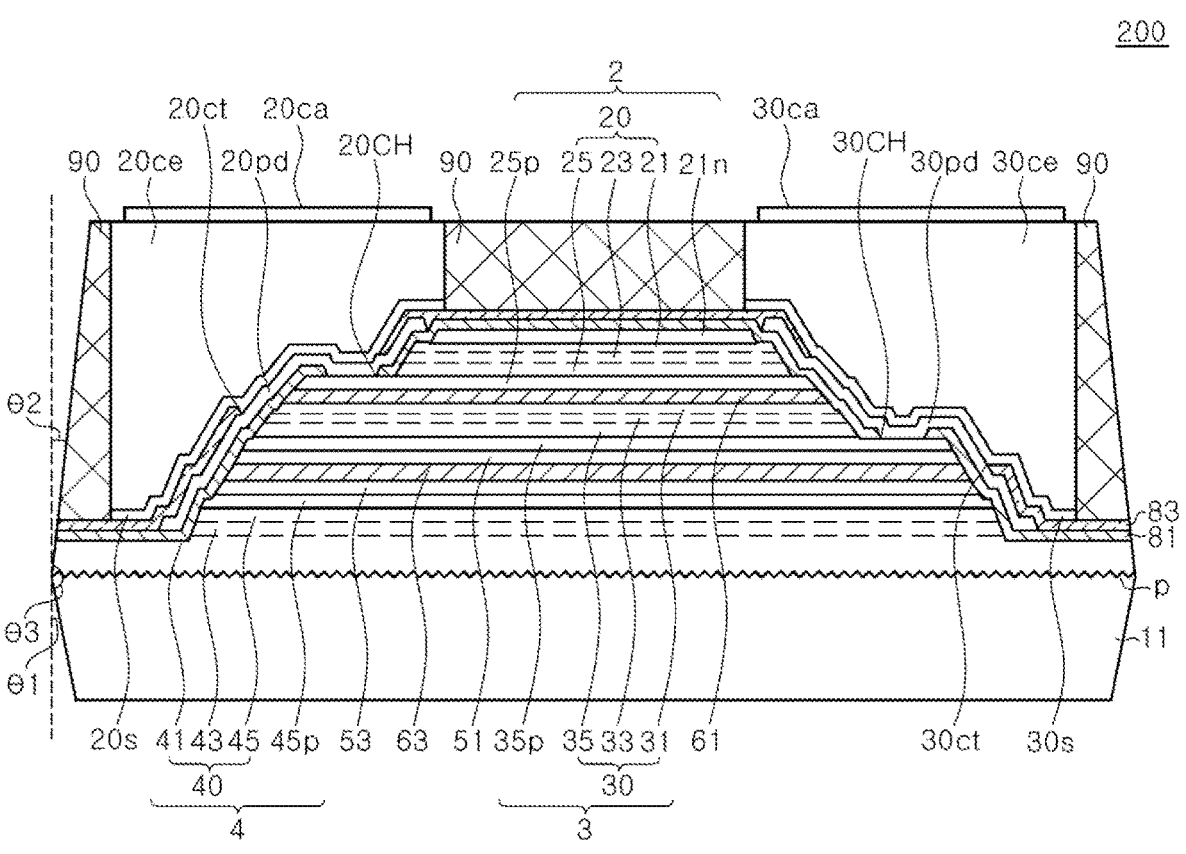
FIG. 16 is a schematic plan view illustrating a light emitting device according to another exemplary embodiment.

FIG. 16 is a schematic plan view illustrating a light emitting device 200 according to an exemplary embodiment.

Referring to FIG. 16, the light emitting device 200 according to the illustrated exemplary embodiment is substantially similar to the light emitting device 100 described with reference to FIGS. 2A, 2B, 2C, and 2D, except that the side surfaces of the substrate 11 and the protection layer 90 are inclined. The light emitting device 200 may also include the extraction element R described with reference to FIGS. 9A, 10A, or 11A.

The side surface of the substrate 11 may be inclined at a first angle $\theta 1$ with respect to a direction perpendicular to an upper surface of the first LED stack 20. That is, the substrate 11 may have a shape in which a width thereof becomes smaller as being disposed further away from the semiconductor layers. When the side surface of the substrate 11 is inclined rather than being vertical, a surface area visible from the side surface is increased, and accordingly, light may be focused in the direction perpendicular to the substrate 11, thereby reducing the deviation of the viewing angle. Furthermore, since a side region of the substrate 11 is reduced, a total volume of the substrate 11 is reduced, and in particular, a volume of the substrate 11 disposed in a region that is not vertically overlapped with the active layers 23, 33, and 43 of the light emitting device 200 is reduced, a volume of a path through which light has to pass is reduced, thereby increasing the light extraction efficiency.

In addition, when a plurality of pixels is arrayed, a separation distance between the light emitting devices 200 may be increased as being closer to a light exiting surface of the substrate 11. Adjacent pixels interfere with and block a side view, which may cause the deviation in the viewing angle and cause color deviation depending on the viewing angle. However, since the separation distance between the substrates 11 according to the illustrated exemplary embodiment is increased in the light exiting direction, blocking of the view may be alleviated, thereby reducing a color deviation.

The side surface of the protection layer 90 may be inclined at a second angle $\theta 2$ with respect to the direction perpendicular to the upper surface of the first LED stack 20. The protection layer 90 may have a shape in which a width thereof becomes smaller as being disposed further away from the substrate 11. When the plurality of pixels is arrayed, a distance between outer surfaces of the protection layer 90 between adjacent pixels becomes smaller as being closer to the light emitting surface of the substrate 11. By forming the outer surfaces of the protection layer 90 inclined, when the molding layer including a light absorbing material is filled between the plurality of pixels, that is, the light emitting devices 200, a larger amount of light absorbing material may be filled between the light emitting devices 200, and thus, the color deviation depending on the viewing angle may be reduced by preventing color mixing depending on the viewing angle. The side surface of the first conductivity type semiconductor layer 41 of the third LED stack 40 may also have an inclined shape.

The inclined first angle $\theta 1$ of the side surface of the substrate 11 may be equal to or greater than the inclined second angle $\theta 2$ of the protection layer 90, and a third angle $\theta 3$ between the inclined surface of the side surface of the substrate 11 and the inclined surface of the protection layer 90 may form an obtuse angle greater than 90° and less than 180°. Through this angular shape, it is possible to reduce the color deviation depending on the viewing angle while maintaining the light extraction efficiency.

The first through third LED stacks 20, 30, and 40 may have a form in which LEDs emitting the same color are stacked. For example, the first LED stack 20 may emit a first light, and the second LED stack 30 may also emit light of a same color as that of the first light. The first light may be any color such as red, green, or blue. As such, a light emitting device may not include three stacked LEDs, and may be formed by stacking only the first LED and the second LED stack so as to realize a desired color. When the first LED stack 20 and the second LED stack 30 are red, the above-described extraction element R may be disposed so as to improve an extraction synergy of light of the same color.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
a first sub-unit configured to emit light of a first wavelength;
a second sub-unit disposed under the first sub-unit and configured to emit light of a second wavelength longer than the first wavelength; and
a third sub-unit disposed under the second sub-unit and configured to emit light of a third wavelength longer than the first wavelength,
wherein:
the first sub-unit, the second sub-unit, and the third sub-unit comprise a first LED stack, a second LED stack, and a third LED stack, respectively;
the first sub-unit further comprises a first upper contact electrode and a first lower contact electrode electrically connected to an upper surface and a lower surface of the first LED stack, respectively, and an extraction element configured to increase a light extraction efficiency of the first wavelength; and
the extraction element is disposed between the first LED stack and the first upper contact electrode and covers the upper surface and a side surface of the first LED stack.

2. The light emitting device of claim 1,
wherein the extraction element comprises a distributed Bragg reflector.

3. The light emitting device of claim 2, wherein:
the first LED stack includes a first conductivity type semiconductor layer, an active layer, and a second conductivity type semiconductor layer; and
the first upper contact electrode is in ohmic contact with the first conductivity type semiconductor layer.

4. The light emitting device of claim 3, wherein:
the distributed Bragg reflector is patterned to expose an upper surface of the first conductivity type semiconductor layer, and
the first upper contact electrode is connected to the exposed first conductivity type semiconductor layer.

5. The light emitting device of claim 4, wherein:
the first conductivity type semiconductor layer is exposed in a plurality of regions spaced apart from one another; and
the first upper contact electrode is connected to the first conductivity type semiconductor layer in the plurality of regions.

6. The light emitting device of claim 2,
wherein the distributed Bragg reflector has a thickness in a range of 1 μm to 5 μm.

7. The light emitting device of claim 1,
wherein the extraction element is disposed between the first LED stack and the second sub-unit.

8. The light emitting device of claim 7,
wherein the extraction element provides regions having different refraction indices in a transverse direction between the first LED stack and the second sub-unit.

9. The light emitting device of claim 8, wherein:
the first lower contact electrode is in ohmic contact with a lower portion of the first LED stack; and

the extraction element comprises a material layer having a refraction index different from that of the first lower contact electrode.

10. The light emitting device of claim 9,
wherein the extraction element is disposed between the first lower contact electrode and the first LED stack.

11. The light emitting device of claim 10, wherein:
the extraction element is patterned to expose the lower surface of the first LED stack; and
the first lower contact electrode is connected to the exposed lower surface of the first LED stack.

12. The light emitting device of claim 9, further comprising:
a first adhesive layer disposed between the first sub-unit and the second sub-unit, wherein:
the first lower contact electrode is patterned to have a plurality of holes; and
the extraction element comprises the first adhesive layer filling the plurality of holes.

13. The light emitting device of claim 8, wherein:
the first lower contact electrode is in ohmic contact with a lower portion of the first LED stack; and
the extraction element is disposed between the first lower contact electrode and the second sub-unit.

14. The light emitting device of claim 13, further comprising:
a first adhesive layer disposed between the first sub-unit and the second sub-unit, wherein:
the extraction element is patterned to expose the first lower contact electrode; and
the first adhesive layer contacts the exposed first lower contact electrode.

15. The light emitting device of claim 13,
wherein the extraction element includes a concavo-convex pattern formed on a lower surface of the first lower contact electrode.

16. A light emitting module, comprising:
a circuit board; and
a plurality of light emitting devices arranged on the circuit board,
each of the light emitting devices, comprising:
a first sub-unit configured to emit light of a first wavelength;
a second sub-unit disposed under the first sub-unit and configured to emit light of a second wavelength longer than the first wavelength; and
a third sub-unit disposed under the second sub-unit and configured to emit light of a third wavelength longer than the first wavelength,
wherein:
the first sub-unit, the second sub-unit, and the third sub-unit comprise a first LED stack, a second LED stack, and a third LED stack, respectively;
the first sub-unit further comprises a first upper contact electrode and a first lower contact electrode electrically connected to an upper surface and a lower surface of the first LED stack, respectively, and an extraction element configured to increase a light extraction efficiency of the first wavelength; and
the extraction element is disposed between the first LED stack and the first upper contact electrode and covers the upper surface and a side surface of the first LED stack.

17. The light emitting module of claim 16,
wherein the extraction element comprises a distributed Bragg reflector.

18. The light emitting module of claim 16, wherein the extraction element is disposed between the first LED stack and the second sub-unit.

19. The light emitting module of claim 18, wherein the extraction element provides regions having different refraction indices in a transverse direction between the first LED stack and the second sub-unit.

\*  \*  \*  \*  \*